(12) United States Patent
Li et al.

(10) Patent No.: US 8,035,280 B2
(45) Date of Patent: Oct. 11, 2011

(54) MEMS VIBRATING STRUCTURE USING A SINGLE-CRYSTAL PIEZOELECTRIC THIN-FILM LAYER HAVING DOMAIN INVERSIONS

(75) Inventors: Sheng-Shian Li, Yangmei Township (TW); Seungbae Lee, Greensboro, NC (US); Kushal Bhattacharjee, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/037,584

(22) Filed: Mar. 1, 2011

(65) Prior Publication Data

US 2011/0148252 A1   Jun. 23, 2011

Related U.S. Application Data

(63) Continuation of application No. 12/263,883, filed on Nov. 3, 2008, now Pat. No. 7,898,158.

(60) Provisional application No. 60/984,597, filed on Nov. 1, 2007.

(51) Int. Cl.
*H01L 41/08* (2006.01)
(52) U.S. Cl. .................... 310/351; 310/328; 257/414
(58) Field of Classification Search ............. 310/328, 310/351; 257/414
See application file for complete search history.

(56) References Cited

U.S. PATENT DOCUMENTS

| | | | |
|---|---|---|---|
| 6,909,221 B2 | 6/2005 | Ayazi et al. | |
| 7,250,705 B2 | 7/2007 | Dewa et al. | |
| 7,492,241 B2 | 2/2009 | Piazza et al. | |
| 7,586,239 B1 | 9/2009 | Li et al. | |
| 7,626,846 B2* | 12/2009 | Rao et al. | 365/145 |
| 7,639,105 B2* | 12/2009 | Ayazi et al. | 333/186 |
| 7,750,759 B1* | 7/2010 | Lee et al. | 333/186 |
| 7,898,158 B1 | 3/2011 | Li et al. | |
| 2004/0125472 A1 | 7/2004 | Belt | |
| 2010/0237709 A1 | 9/2010 | Hall et al. | |

OTHER PUBLICATIONS

Batchko, Robert G. et al., "Backswitch Poling in Lithium Niobate for High-Fidelity Domain Patterning and Efficient Blue Light Generation," Applied Physics Letters, Sep. 1999, pp. 1673-1675, vol. 75, No. 12, American Institute of Physics.
Brown, Paul T. et al., "Control of Domain Structures in Lithium Tantalate Using Interferometric Optical Patterning," Optics Communications, May 15, 1999, pp. 310-316, vol. 163, Elsevier Science B.V.
Chen, Yan-Feng et al., "High-Frequency Resonance in Acoustic Superlattice of Periodically Poled LiTaO3," Appl. Phys. Lett., Feb. 1997, pp. 592-594, vol. 70, American Institute of Physics.
Courjon, E. et al., "Pure Longitudinal Plate Mode Excited by Poled Domains Transducers on LiNbO3," Proceedings, EFTF*IEEE-FCS'07, May 29-Jun. 1, 2007, pp. 1073-1076, IEEE.

(Continued)

*Primary Examiner* — Jaydi San Martin
(74) *Attorney, Agent, or Firm* — Withrow & Terranova, P.L.L.C.

(57) ABSTRACT

The present invention relates to a micro-electro-mechanical systems (MEMS) vibrating structure supported by a MEMS anchor system, and includes a single-crystal piezoelectric thin-film layer having domain inversions, which determine certain vibrational characteristics of the MEMS vibrating structure. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

25 Claims, 24 Drawing Sheets

OTHER PUBLICATIONS

Ho, Gavin K. et al., "High-Order Composite Bulk Acoustic Resonators," Technical Digest, IEEE Int. Conf. on Micro Electro Mechanical Systems, Jan. 21-25, 2007, pp. 791-794, IEEE.

Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, Oct. 2005, pp. 2077-2079, vol. 17, No. 10, IEEE.

Kumar, A. K. Sarin et al., "High-Frequency Surface Acoustic Wave Device Based on Thin-Film Piezoelectric Interdigital Transducers," Applied Physics Letters, Sep. 2004, pp. 1757-1759, vol. 85, No. 10, American Institute of Physics.

Myers, L. E. et al., "Quasi-Phase-Matched Optical Parametric Oscillators in Bulk Periodically Poled LiNbO3," J. Opt. Soc. Am. B, Nov. 1995, pp. 2102-2116, vol. 12, No. 11, Optical Society of America.

Ostrovskii, I. V. et al., "Free Vibration of Periodically Poled Ferroelectric Plate," Journal of Applied Physics, 2006, pp. 114106-1 to 114106-6, vol. 99, No. 114106, American Institute of Physics.

Osugi, Yukihisa et al., "Single Crystal FBAR with LiNbO3 and LiTaO3 Piezoelectric Substance Layers," International Microwave Symposium (IEEE-MTT-S'07), Jun. 3-8, 2007, pp. 873-876, IEEE.

Pastureaud, Thomas et al., "High-Frequency Surface Acoustic Waves Excited on Thin-Oriented LiNbO3 Single-Crystal Layers Transferred onto Silicon," IEEE Transactions on Ultrasonics, Ferroelectrics, and Frequency Control, Apr. 2007, pp. 870-876, vol. 54, No. 4, IEEE.

"Soitec Innovative Process for Materials Treatments—Smart Cut(R)," 2007, Soitec.

Stephanou, P. J. et al., "GHz Contour Extensional Mode Aluminum Nitride MEMS Resonators," Proceedings, IEEE Ultrasonics Symposium, Oct. 2-6, 2006, pp. 2401-2404, IEEE.

Stephanou, P. J. et al., "GHz Higher Order Contour Mode AlN Annular Resonators," Technical Digest, IEEE 20th Int. Conf. on Micro Electro Mechanical Systems, 2007, IEEE.

Yamada, M. et al., "First-Order Quasi-Phase Matched LiNbO3 Waveguide Periodically Poled by Applying an External Field for Efficient Blue Second-Harmonic Generation," Appl. Phys. Lett. 1993, pp. 435-436, vol. 62, No. 5, American Institute of Physics.

Yong-Yuan Zhu et al., "Crossed Field Excitation of an Acoustic Superlattice," J. Phys. D: Appl. Phys., 1996, pp. 185-187, vol. 29, No. 1, IOP Publishing Ltd.

Yong-Yuan Zhu et al., "Ultrasonic Excitation and Propagation in an Acoustic Superlattice," J. Appl. Phys., Aug. 1992, pp. 904-914, vol. 72, No. 3, American Institute of Physics.

Notice of Allowance mailed Oct. 28, 2010 regarding U.S. Appl. No. 12/263,883 now U.S. Patent No. 7,898,158.

* cited by examiner

MEMS VIBRATING STRUCTURE USING A SINGLE-CRYSTAL PIEZOELECTRIC THIN-FILM LAYER HAVING DOMAIN INVERSIONS

This application is a continuation of U.S. patent application Ser. No. 12/263,883, filed on Nov. 3, 2008, now U.S. Pat. 7,898,158, which claims the benefit of U.S. Provisional Patent Application No. 60/984,597 filed Nov. 1, 2007, the disclosures of which are incorporated herein by reference in their entireties.

FIELD OF THE INVENTION

Embodiments of the present invention relate to micro-electro-mechanical systems (MEMS) vibrating structures, such as MEMS sensors, MEMS resonators, MEMS oscillators, or MEMS filters, which may be used in radio frequency (RF) communications systems.

BACKGROUND OF THE INVENTION

Resonators are devices that are often used in radio frequency (RF) circuitry in frequency reference circuits and filter circuits. Generally, resonators need to be high-Q, low loss, stable, have a low temperature coefficient of frequency, have high repeatability, have high accuracy, have a low motional impedance, have a large transduction area, have low electrode resistance, and have high power handling capability. Additionally, RF circuits often require multiple resonators having different resonant frequencies. RF applications, such as RF filters, may span wide ranges of operating frequencies and bandwidths. Resonators having a high electromechanical coupling coefficient may tend to have wide bandwidth.

One common type of resonator is a thin-film bulk acoustic resonator (FBAR), according to the prior art. An FBAR may use a piezoelectric thin-film material surrounded above and below with conductors. Aluminum Nitride may be deposited as a piezoelectric thin-film material; however, the FBAR may predominantly resonate in a thickness mode. Therefore, a resonant frequency of the FBAR may be dependent upon the thickness of a deposited Aluminum Nitride layer, which may be difficult to control. Additionally, a separate Aluminum Nitride layer may be needed for an additional FBAR having a different resonant frequency, which may be limiting or expensive.

An improvement on a traditional FBAR is an FBAR that uses a grown single-crystal FBAR (XBAR), which may have the advantages of good material uniformity, low material defect rates, high material stability, low loss, wide bandwidth, high repeatability, high-Q, and low drift. An alternative to the FBAR is a thin-film piezoelectric-on-substrate resonator (FPOSR), which uses a deposited thin-film, such as Zinc Oxide, on a suspended substrate. The FPOSR may resonate in either a thickness mode or a lateral mode. Lateral vibrations tend to be dependent on the size and shape of the resonator and not dependent upon the thickness of the resonator. However, the deposited thin-film of the FPOSR may have poor frequency stability, high losses, and may have a relatively low electromechanical coupling coefficient due to loading by a substrate layer.

A micro-electro-mechanical systems (MEMS) device includes at least one mechanical element, such as a sensor, an actuator, or a resonator, that is formed using a micromachining process that selectively etches away parts of a wafer. The wafer may include added structural layers and may be made of a semiconductor material, such as Silicon. RF communications systems may use MEMS vibrating structures in MEMS resonators or filter circuits. MEMS resonators may be constructed mechanically to provide excellent acoustic isolation between an anchor and a vibrating structure, which may provide MEMS resonators with a very high-Q. Thus, there is a need for a MEMS resonator which is high-Q, low loss, stable, has a low temperature coefficient of frequency, has a high electromechanical coupling coefficient, has high repeatability, has high accuracy, has a low motional impedance, has a large transduction area, has low electrode resistance, has high power handling capability, and can be produced to address wide ranges of operating frequencies and bandwidths.

SUMMARY OF THE EMBODIMENTS

The present invention relates to a micro-electro-mechanical systems (MEMS) vibrating structure supported by a MEMS anchor system, and includes a single-crystal piezoelectric thin-film layer having domain inversions, which determine certain vibrational characteristics of the MEMS vibrating structure. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

Since the MEMS vibrating structure is formed from a single-crystal material and uses mechanically efficient MEMS construction, the MEMS vibrating structure may be high-Q, low loss, stable, have a low temperature coefficient of frequency, have a high electromechanical coupling coefficient, have high repeatability, and have a low motional impedance.

The single-crystal piezoelectric thin-film layer has piezoelectric properties, such that an applied alternating current (AC) voltage may cause mechanical vibrations. The single-crystal piezoelectric thin-film layer may include Lithium Tantalate or Lithium Niobate for their desirable properties. In one embodiment of the present invention, the single-crystal piezoelectric thin-film layer is sandwiched between two conductive layers, such as metallization layers, such that the single-crystal piezoelectric thin-film layer is a principal resonating layer and may provide the dominant resonant characteristics of the MEMS vibrating structure.

In an alternate embodiment of the present invention, the single-crystal piezoelectric thin-film layer is sandwiched between two conductive layers; however, one of the conductive layers is a principal resonating layer and may provide the dominant resonant characteristics of the MEMS vibrating structure, and the single-crystal piezoelectric thin-film layer may provide mechanical drive. For example, the conductive layer that is a principal resonating layer is a conductive single-crystal semiconductor layer, such as highly-doped Silicon, polysilicon, isotropic, or other materials, which may be significantly thicker than the single-crystal piezoelectric thin-film layer. Alternatively, both the single-crystal piezoelectric thin-film layer and one of the conductive layers may be principal resonating layers and both may contribute to dominant resonant characteristics of the MEMS vibrating structure.

In an additional embodiment of the present invention, the single-crystal piezoelectric thin-film layer is sandwiched between two conductive layers and one of the two conductive layers is sandwiched between the single-crystal piezoelectric thin-film layer and a single-crystal semiconductor layer. The single-crystal semiconductor layer may be conductive or semi-conductive, and may include highly-doped Silicon, doped Silicon, lightly-doped Silicon, non-doped Silicon, polysilicon, isotropic, or other materials. The single-crystal piezoelectric thin-film layer provides the mechanical drive and the single-crystal semiconductor layer, the single-crystal piezoelectric thin-film layer, or both, is a principal resonating layer, and may provide or contribute to the dominant resonant characteristics of the MEMS vibrating structure.

The single-crystal piezoelectric thin-film layer may be driven with an AC voltage to operate as a piezoelectric transducer, or may additionally be driven with a direct current (DC) voltage to additionally operate as an electrostatic transducer based on the capacitance established by the single-crystal piezoelectric thin-film layer sandwiched between two conductive layers. An electrostatic transducer requires both AC and DC voltages for proper operation.

Material that has the potential to become piezoelectric material may have a crystalline structure with randomly oriented dipoles. The material becomes piezoelectric material by substantially aligning the dipoles to form domains, such as Weiss domains. A domain is a region of piezoelectric material having a substantially uniform dipole orientation, which may be created by poling. Poling may include applying a strong poling electric field to a region of the material to substantially force the dipoles into alignment. When the electric field is removed, much of the alignment remains, thereby providing the piezoelectric properties of the poled material, which is called piezoelectric material.

A nominal poling electric field has a nominal poling orientation and may create a nominal domain having a nominal orientation, or nominal polarization. Similarly, an inverted poling electric field has an inverted poling orientation, which may be translated about 180 degrees from the nominal poling orientation, and may create an inverted domain having an inverted orientation, or inverted polarization. The inverted orientation may be translated about 180 degrees from the nominal orientation. A piezoelectric material having domain inversions has at least one nominal domain adjacent to at least one inverted domain. When a uniform electric field is applied to a piezoelectric material having domain inversions, any nominal domains may move in one manner and any inverted domains may move in an opposite manner. For example, a nominal domain may expand and an inverted domain may shrink, or vice versa.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

Figure 3:
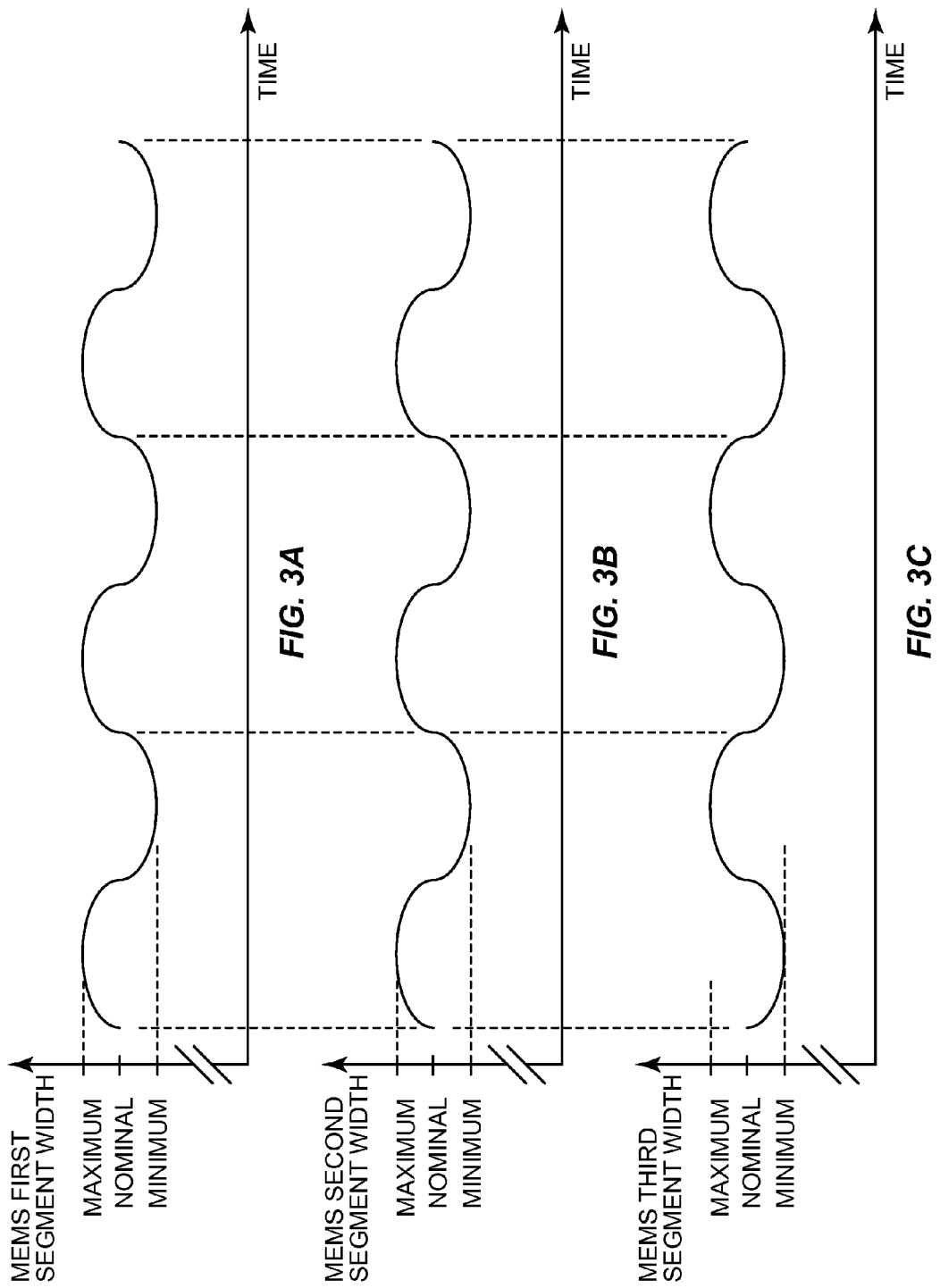

FIGS. 3A, 3B, and 3C are graphs illustrating how MEMS first, second, and third segment widths vary with time.

Figure 4:
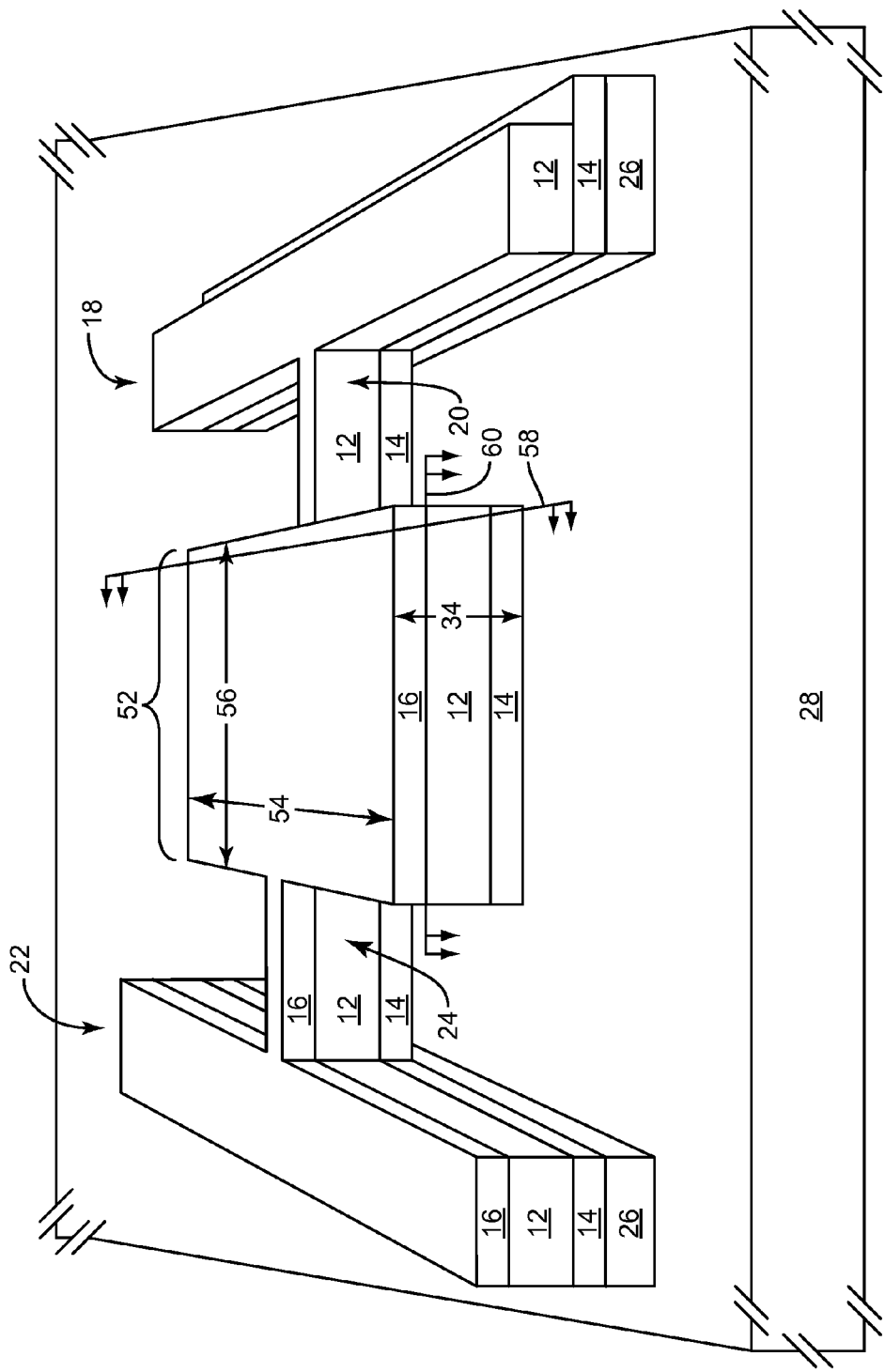

FIG. 4 shows a three-dimensional view of a rectangular-shaped single-port domain inversions based vibrating structure, according to an alternate embodiment of the present invention.

Figure 5:
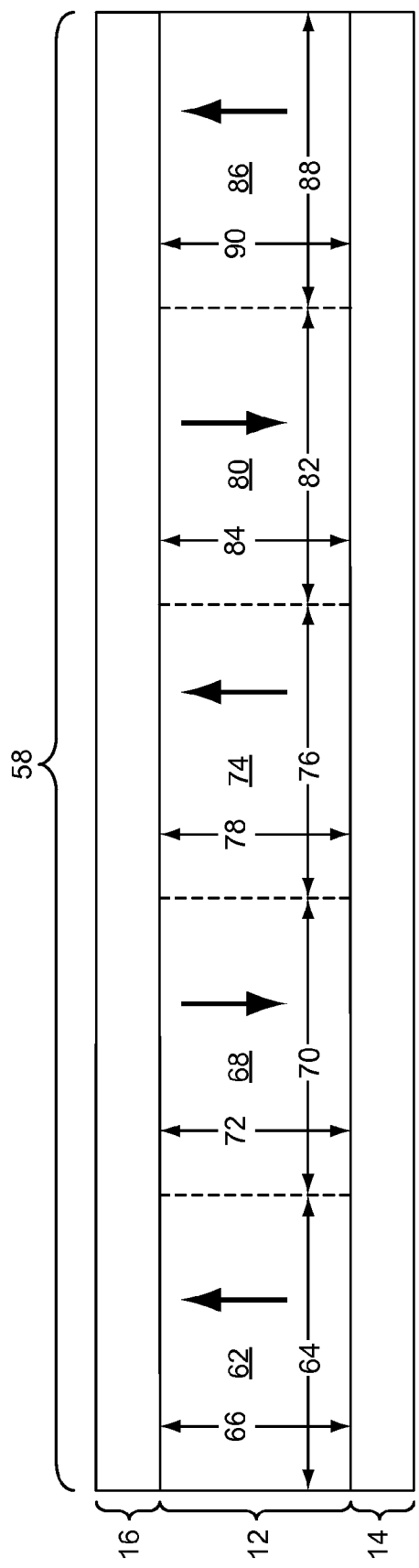

FIG. 5 shows a first cross-section of the rectangular-shaped single-port domain inversions based vibrating structure illustrated in FIG. 4.

Figure 6:
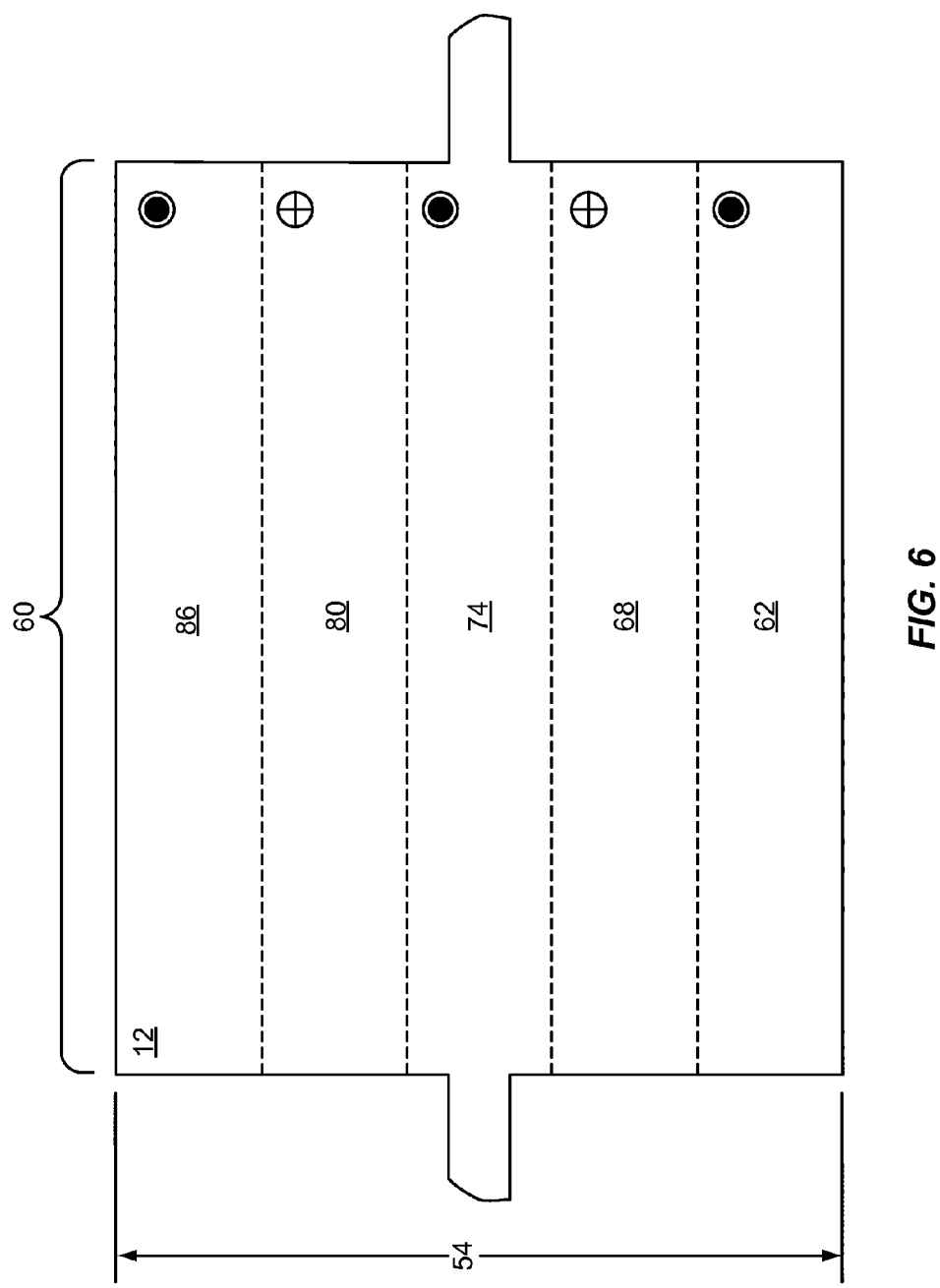
Figure 7:
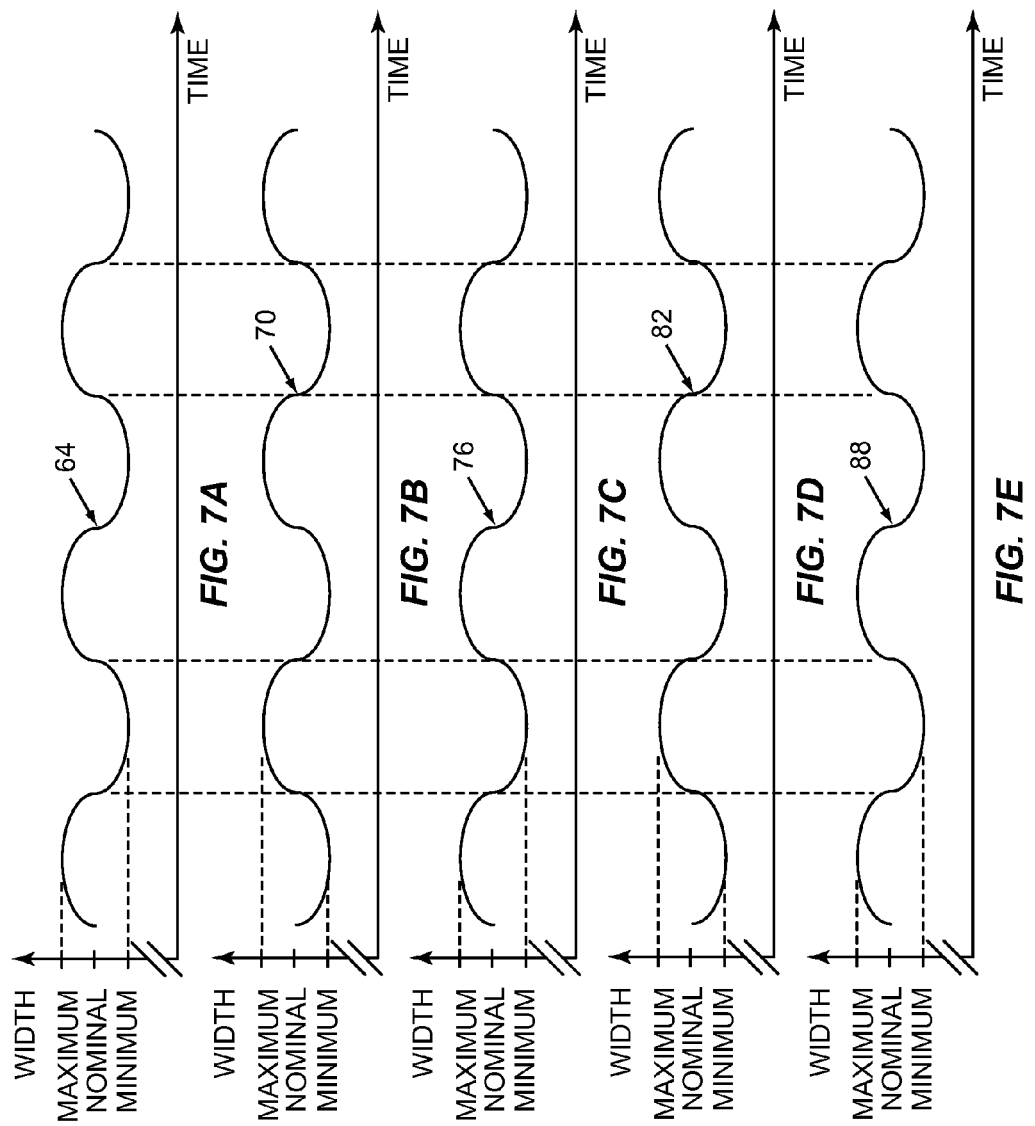
Figure 8:
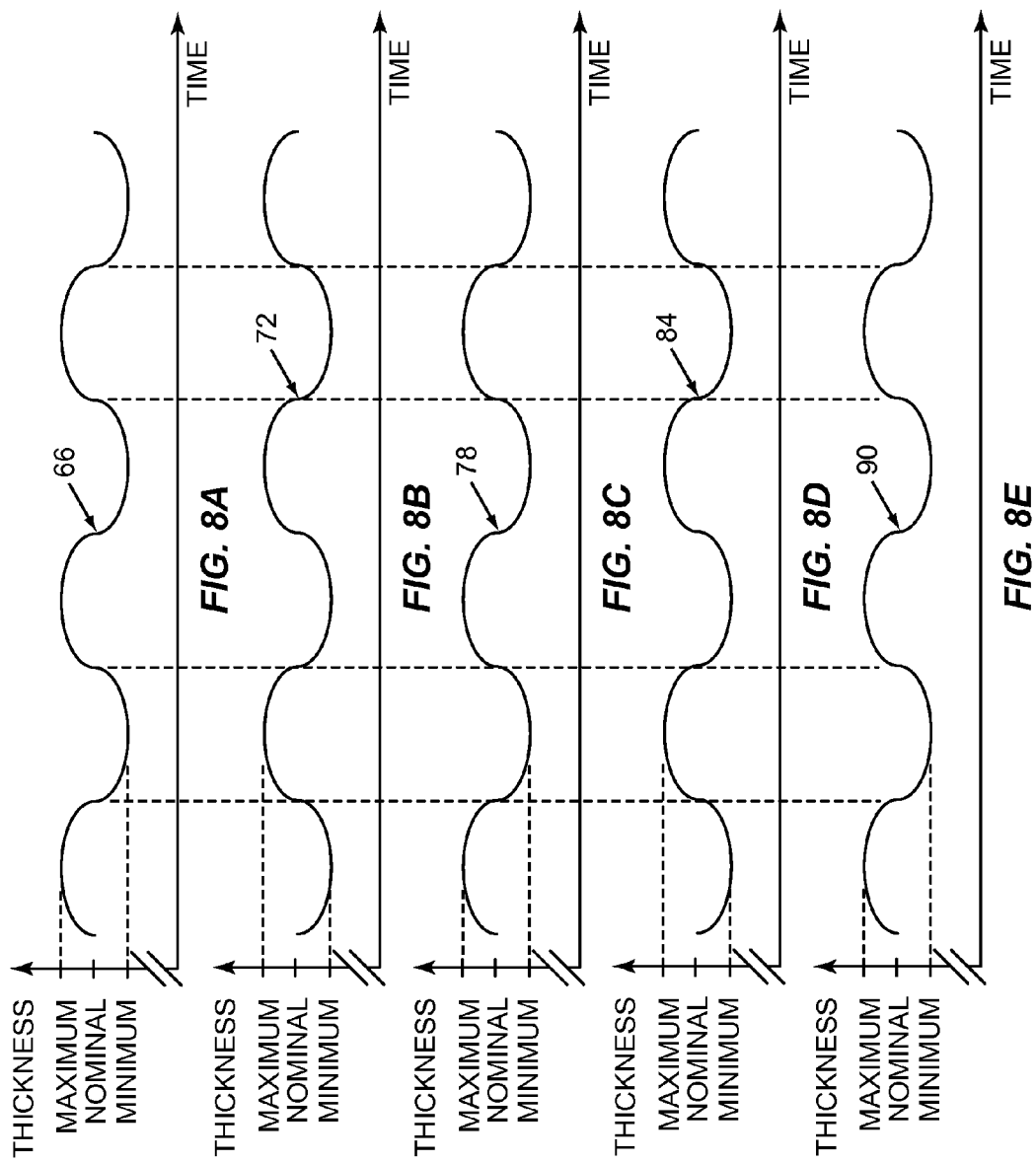

FIG. 6 shows a second cross-section of the rectangular-shaped single-port domain inversions based vibrating structure illustrated in FIG. 4, according to one embodiment of the rectangular-shaped single-port domain inversions based vibrating structure.

FIGS. 7A, 7B, 7C, 7D, and 7E are graphs illustrating how a first nominal domain width, a first inverted domain width, a second nominal domain width, a second inverted domain width, and a third nominal domain width, respectively, of the rectangular-shaped single-port domain inversions based vibrating structure illustrated in FIG. 5 vary with time.

FIGS. 8A, 8B, 8C, 8D, and 8E are graphs illustrating how a first nominal domain thickness, a first inverted domain thickness, a second nominal domain thickness, a second inverted domain thickness, and a third nominal domain thickness, respectively, of the rectangular-shaped single-port domain inversions based vibrating structure illustrated in FIG. 5 vary with time.

Figure 9:
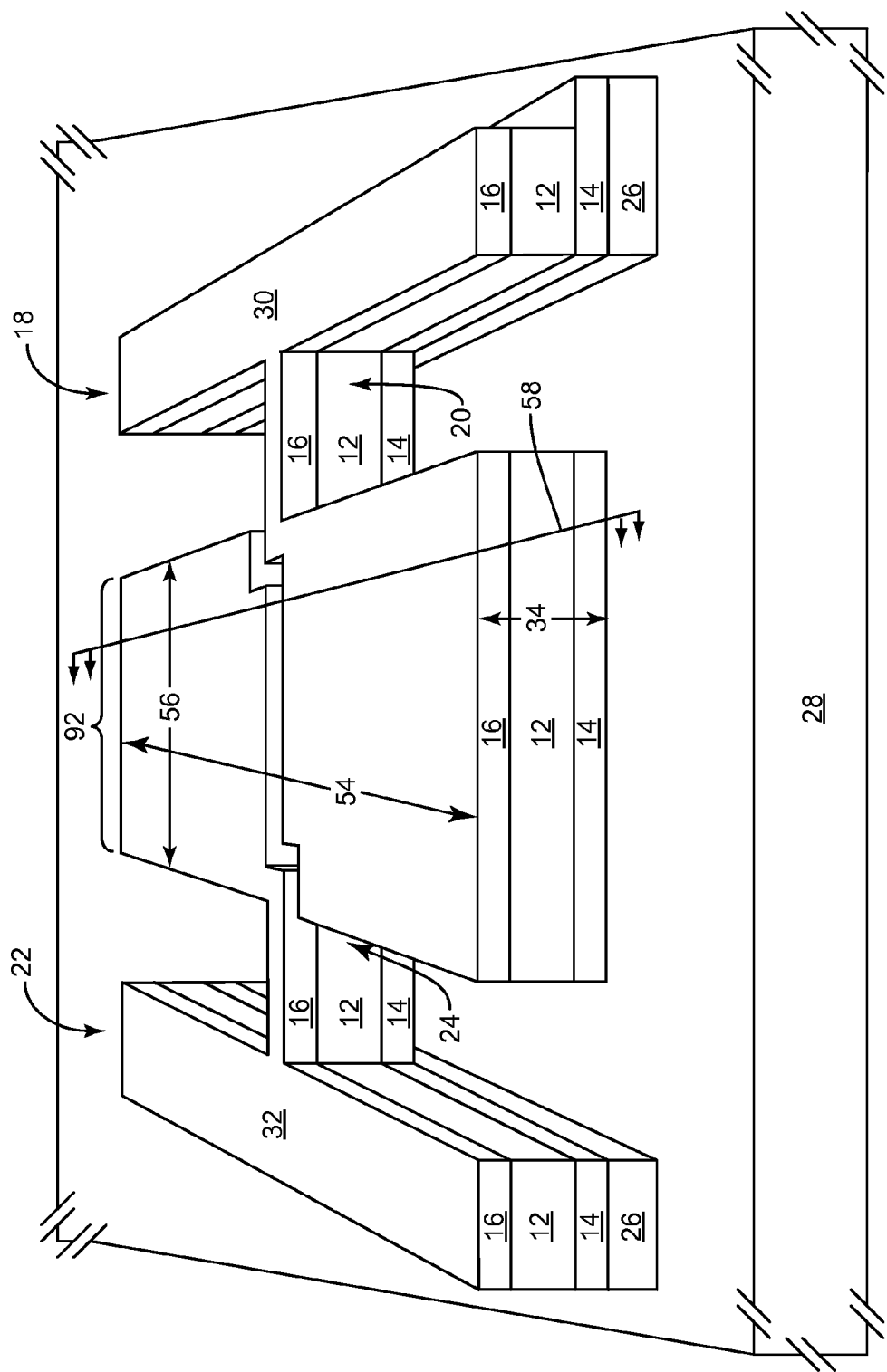

FIG. 9 shows a three-dimensional view of a rectangular-shaped dual-port domain inversions based vibrating structure, according to an additional embodiment of the present invention.

Figure 10:
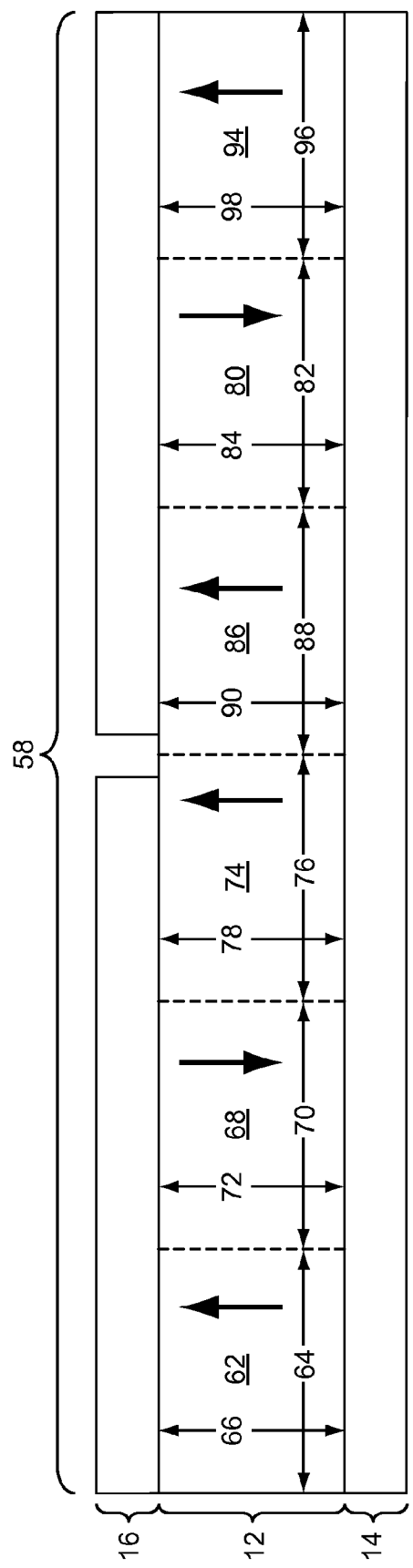
Figure 11:
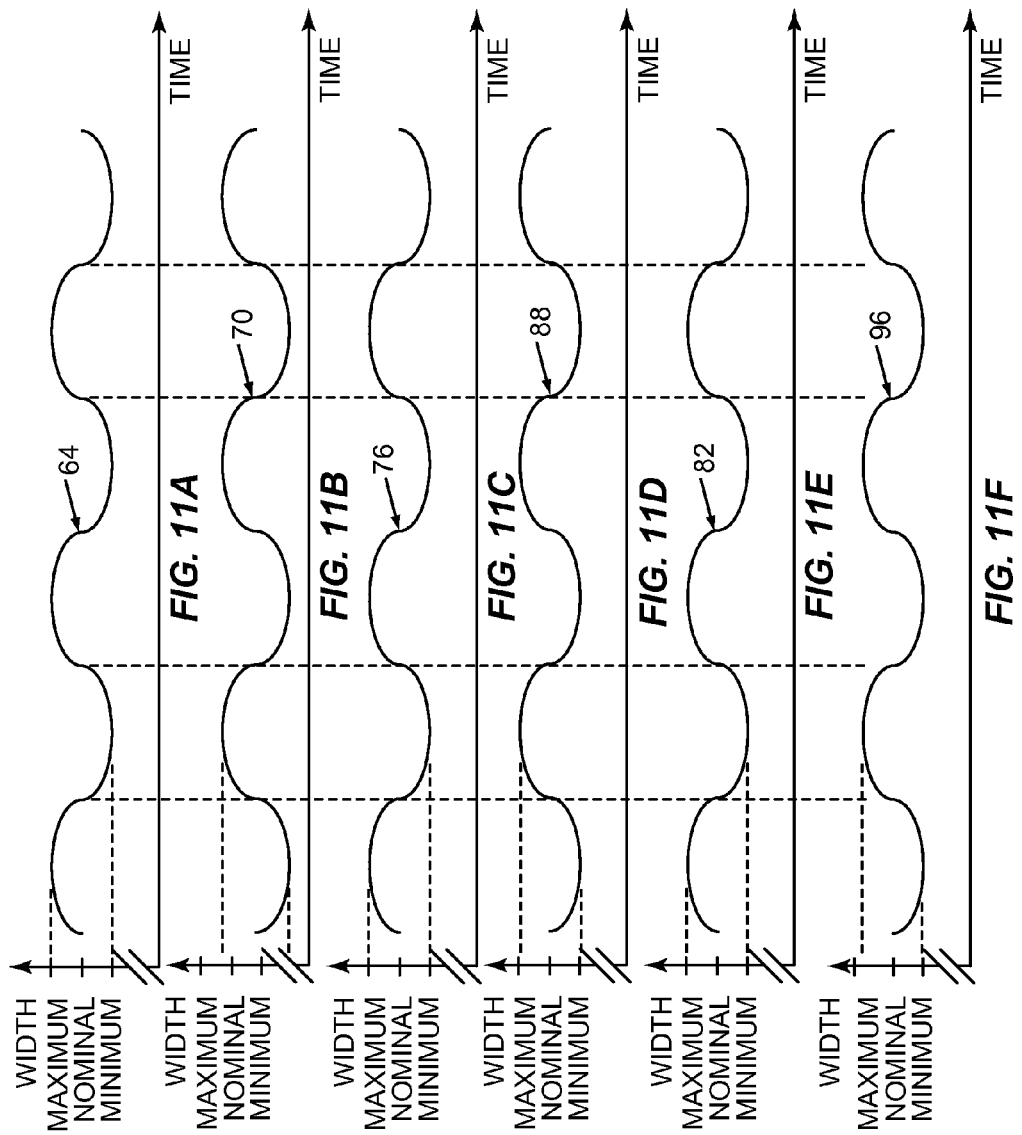

FIG. 10 shows a first cross-section of the rectangular-shaped dual-port domain inversions based vibrating structure illustrated in FIG. 9.

FIGS. 11A, 11B, 11C, 11D, 11E, and 11F are graphs illustrating how a first nominal domain width, a first inverted domain width, a second nominal domain width, a third nominal domain width, a second inverted domain width, and a fourth nominal domain width, respectively, of the rectangular-shaped dual-port domain inversions based vibrating structure illustrated in FIG. 10 vary with time.

Figure 12:
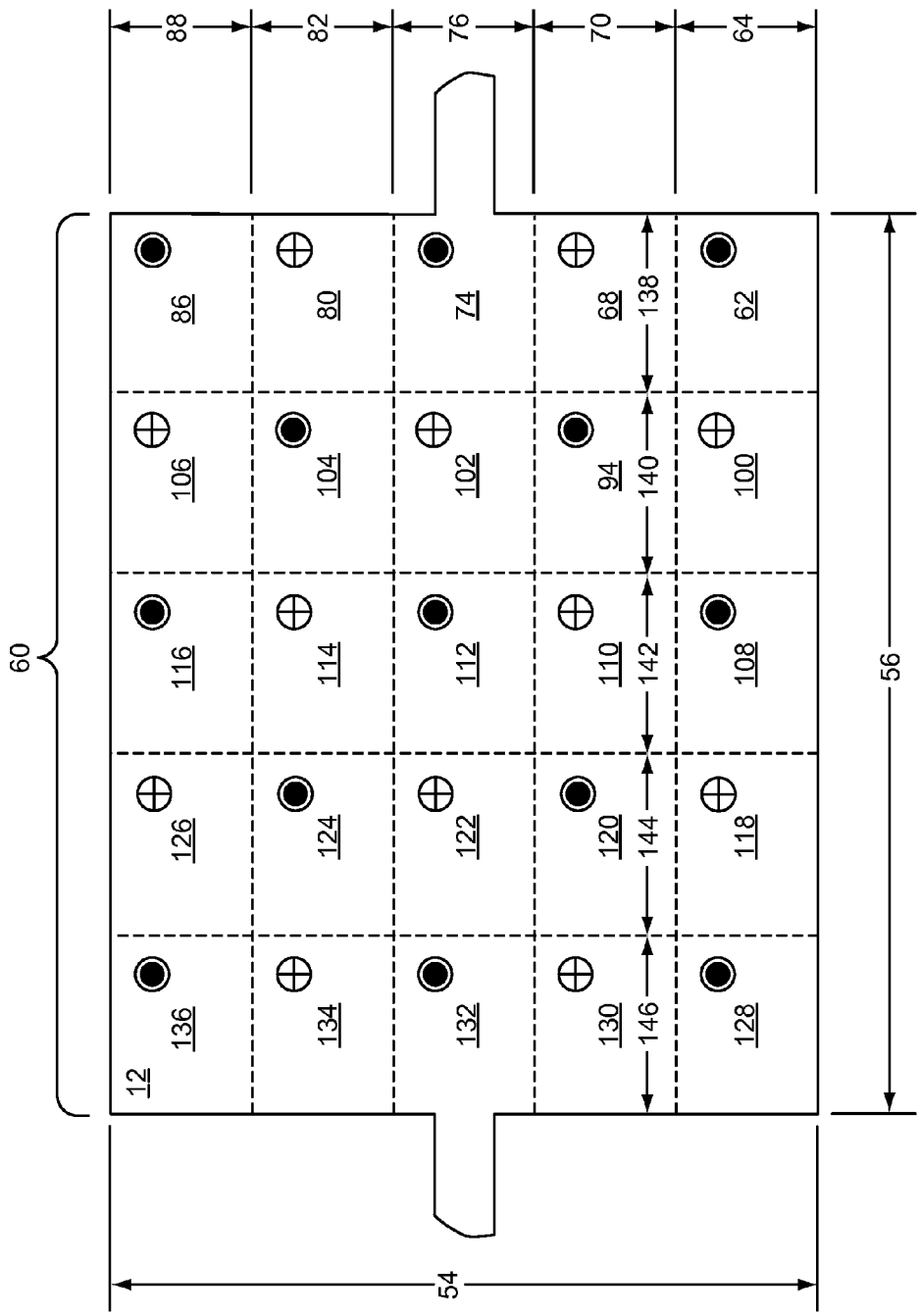

FIG. 12 shows the second cross-section of the rectangular-shaped single-port domain inversions based vibrating structure illustrated in FIG. 4, according to an alternate embodiment of the rectangular-shaped single-port domain inversions based vibrating structure.

Figure 13:
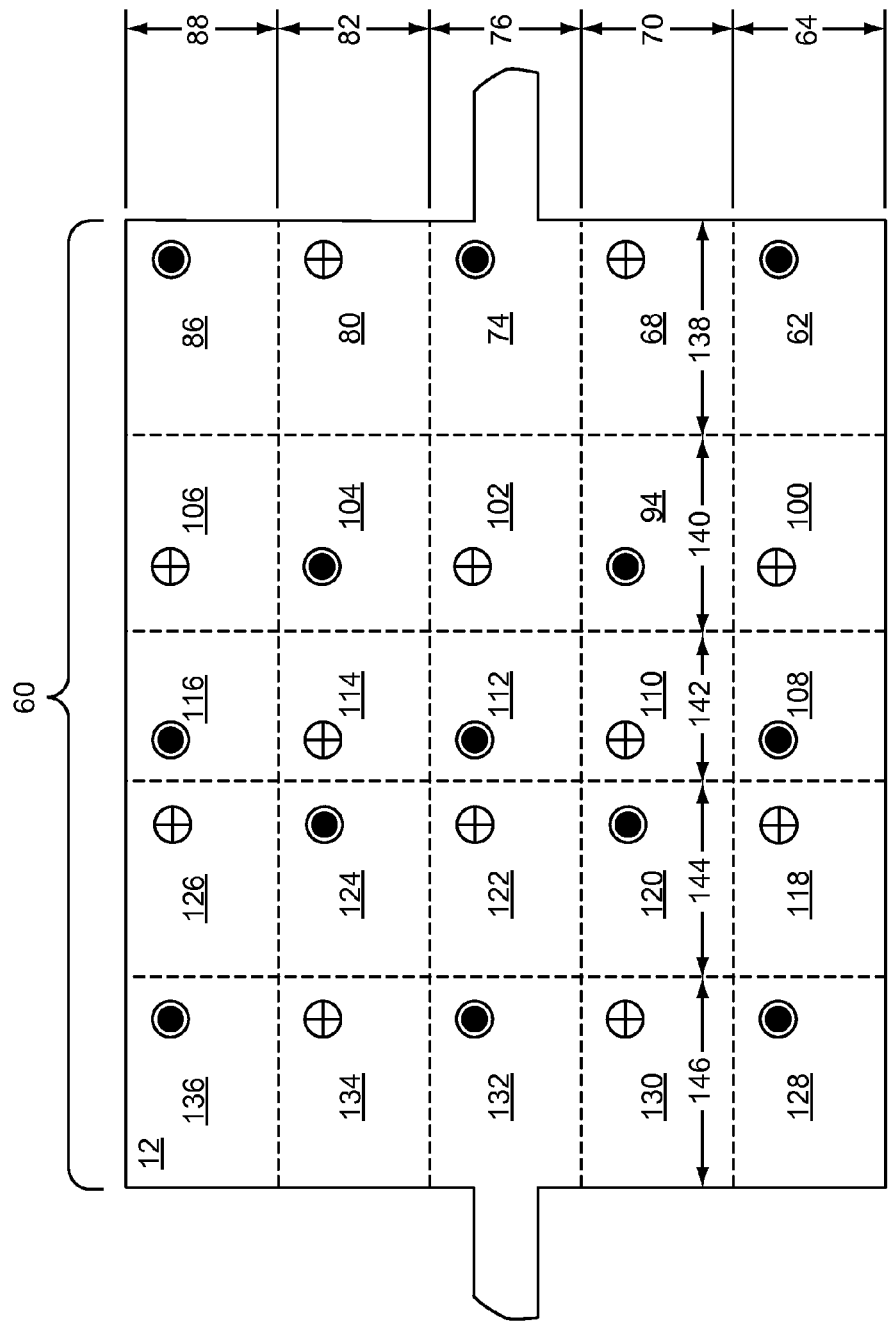

FIG. 13 shows the second cross-section of the rectangular-shaped single-port domain inversions based vibrating structure illustrated in FIG. 4, according to an additional embodiment of the rectangular-shaped single-port domain inversions based vibrating structure.

Figure 14:
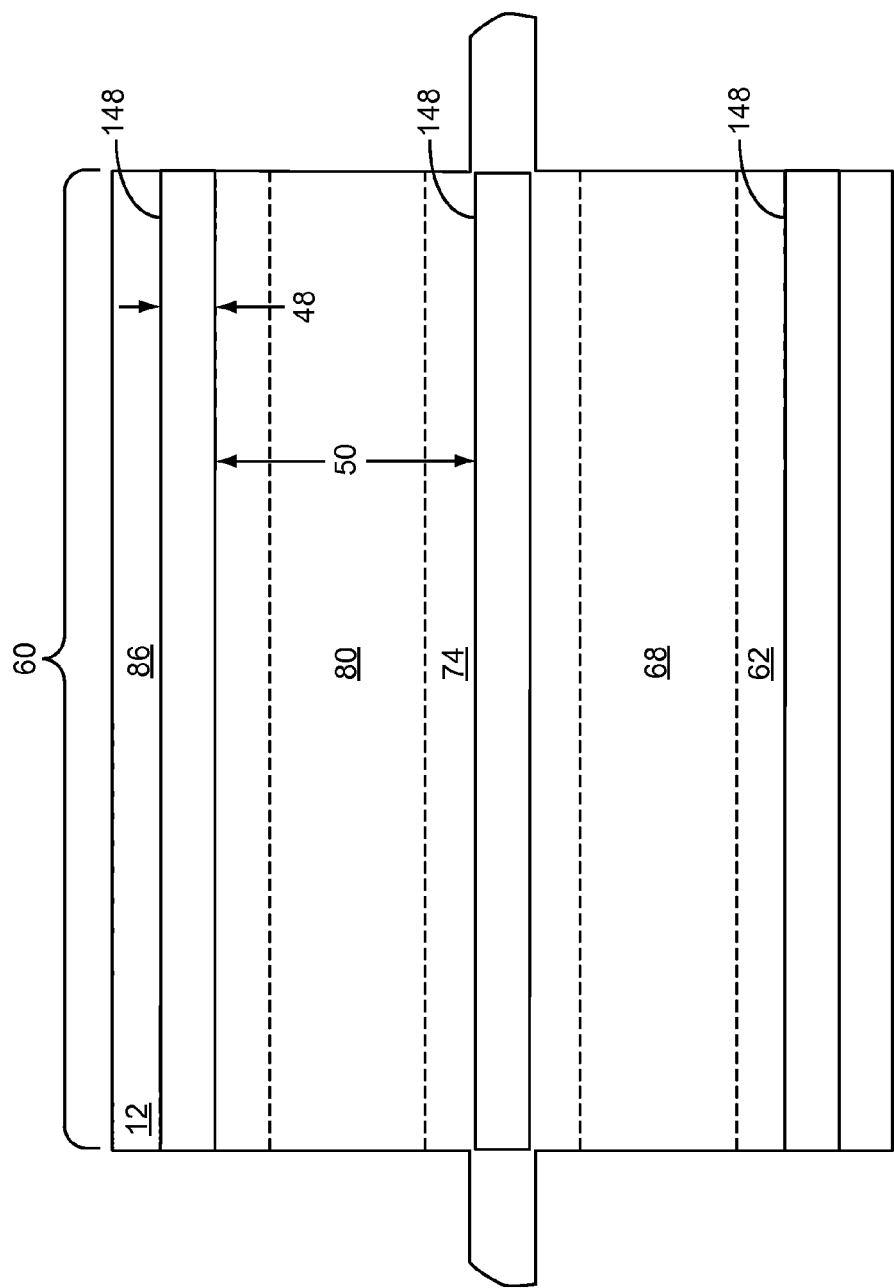

FIG. 14 shows a nominal domain poling structure superimposed over the second cross-section of the rectangular-shaped single-port domain inversions based vibrating structure illustrated in FIG. 6.

Figure 15:
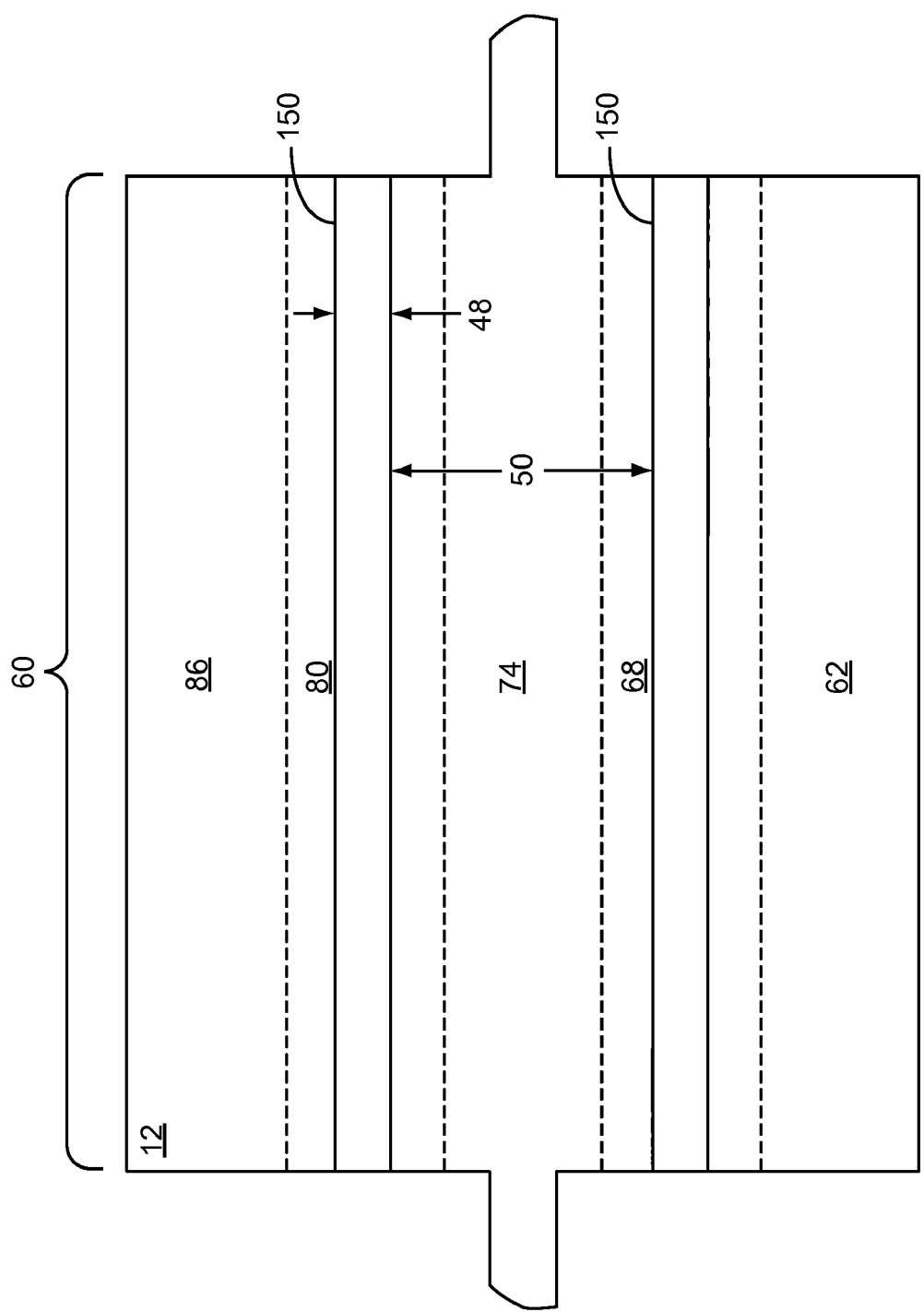

FIG. 15 shows an inverted domain poling structure superimposed over the second cross-section of the rectangular-shaped single-port domain inversions based vibrating structure illustrated in FIG. 6.

Figure 16:
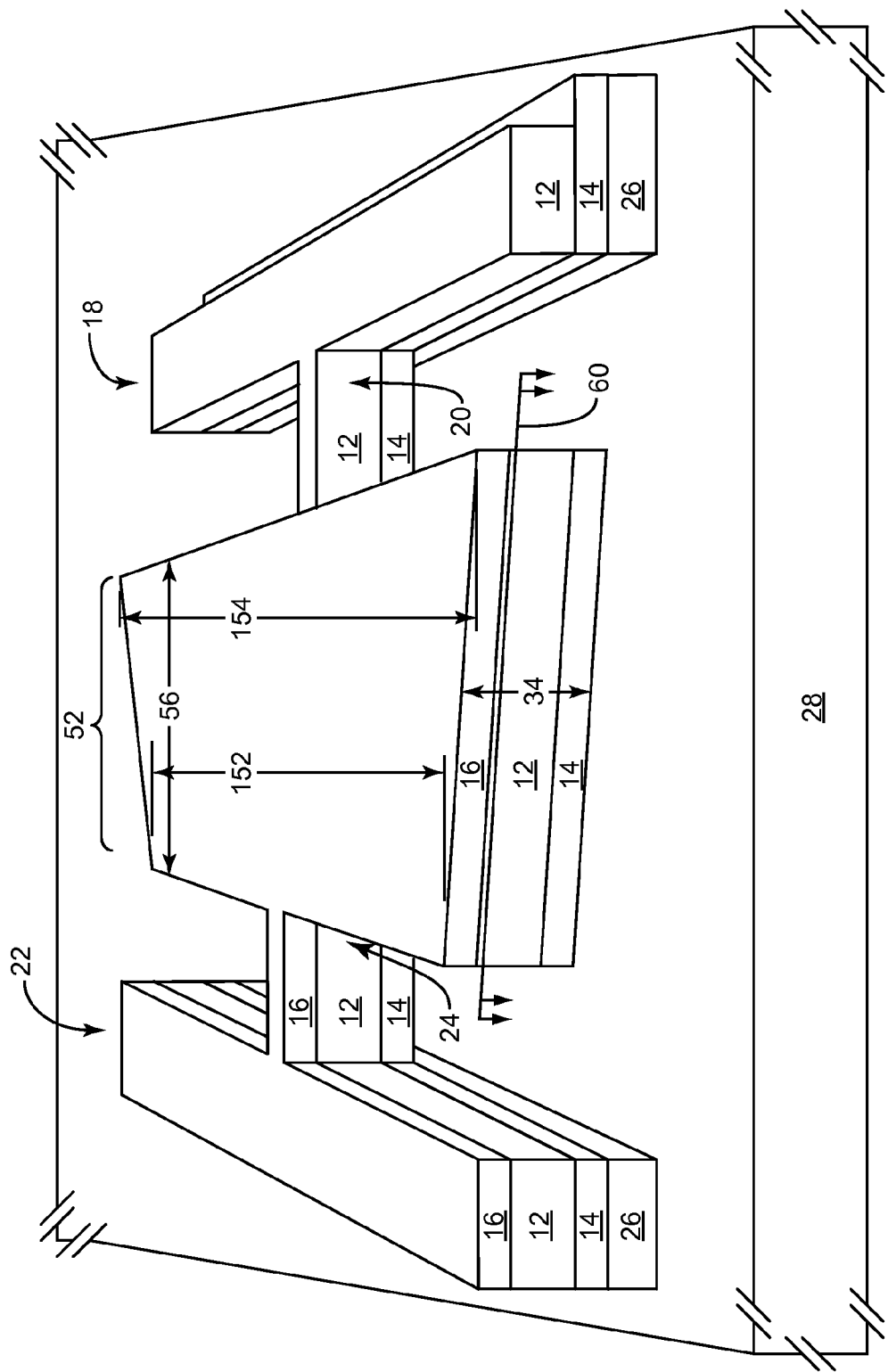

FIG. 16 shows a three-dimensional view of a trapezoidal-shaped single-port domain inversions based vibrating structure, according to another embodiment of the present invention.

Figure 17:
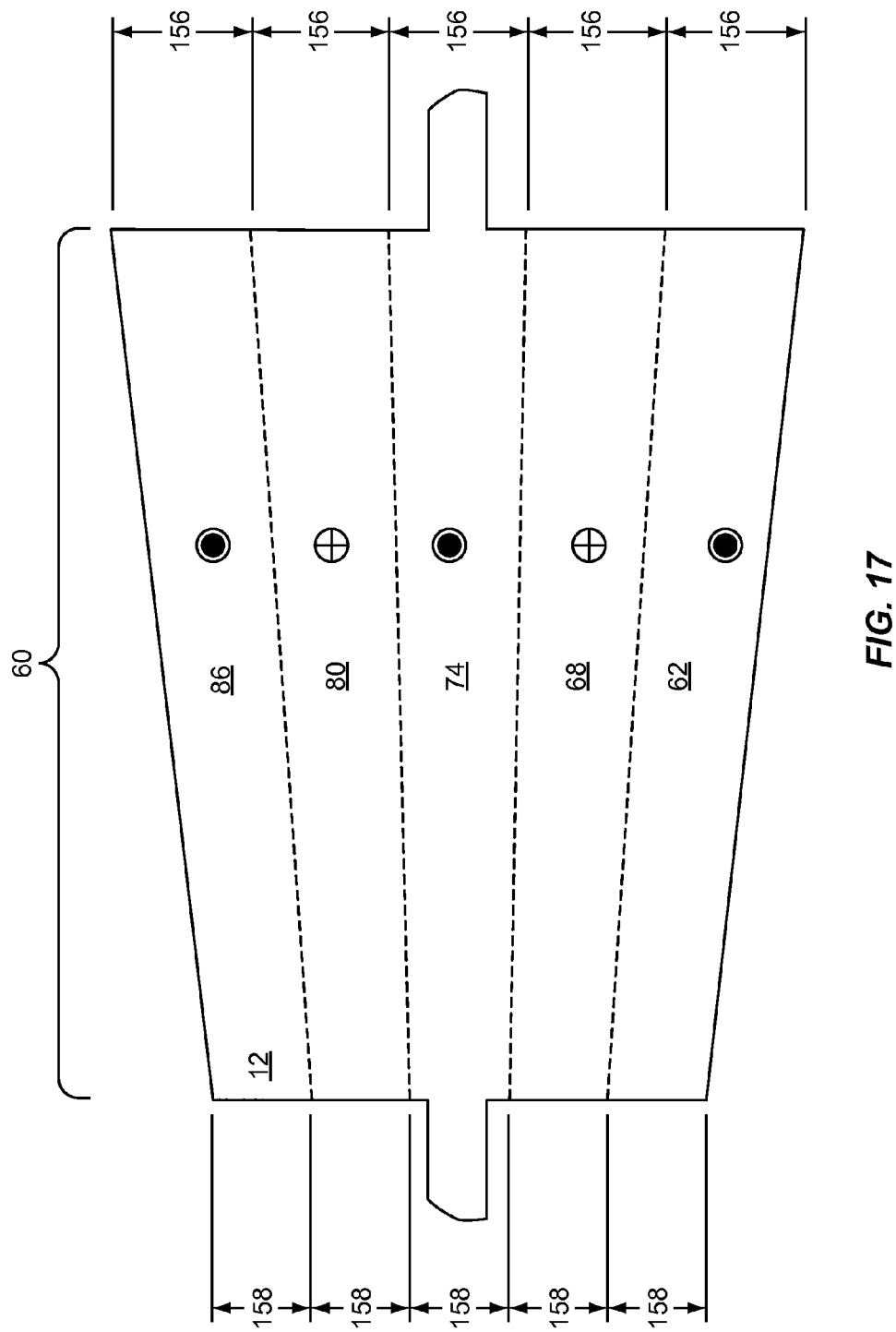

FIG. 17 shows a second cross-section of the trapezoidal-shaped single-port domain inversions based vibrating structure illustrated in FIG. 16, according to one embodiment of the trapezoidal-shaped single-port domain inversions based vibrating structure.

Figure 18:
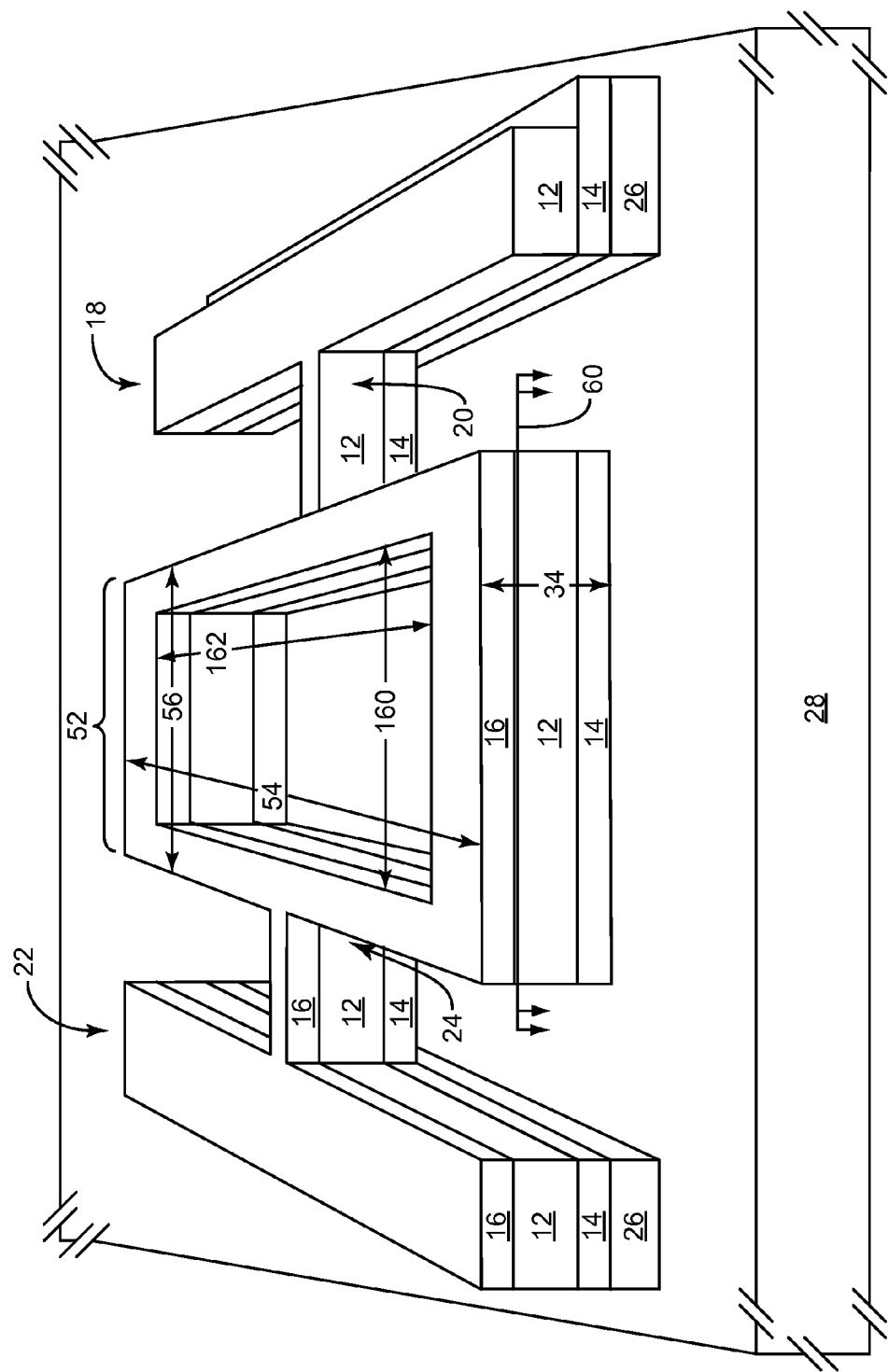

FIG. 18 shows a three-dimensional view of a rectangular ring-shaped single-port domain inversions based vibrating structure, according to a supplemental embodiment of the present invention.

Figure 19:
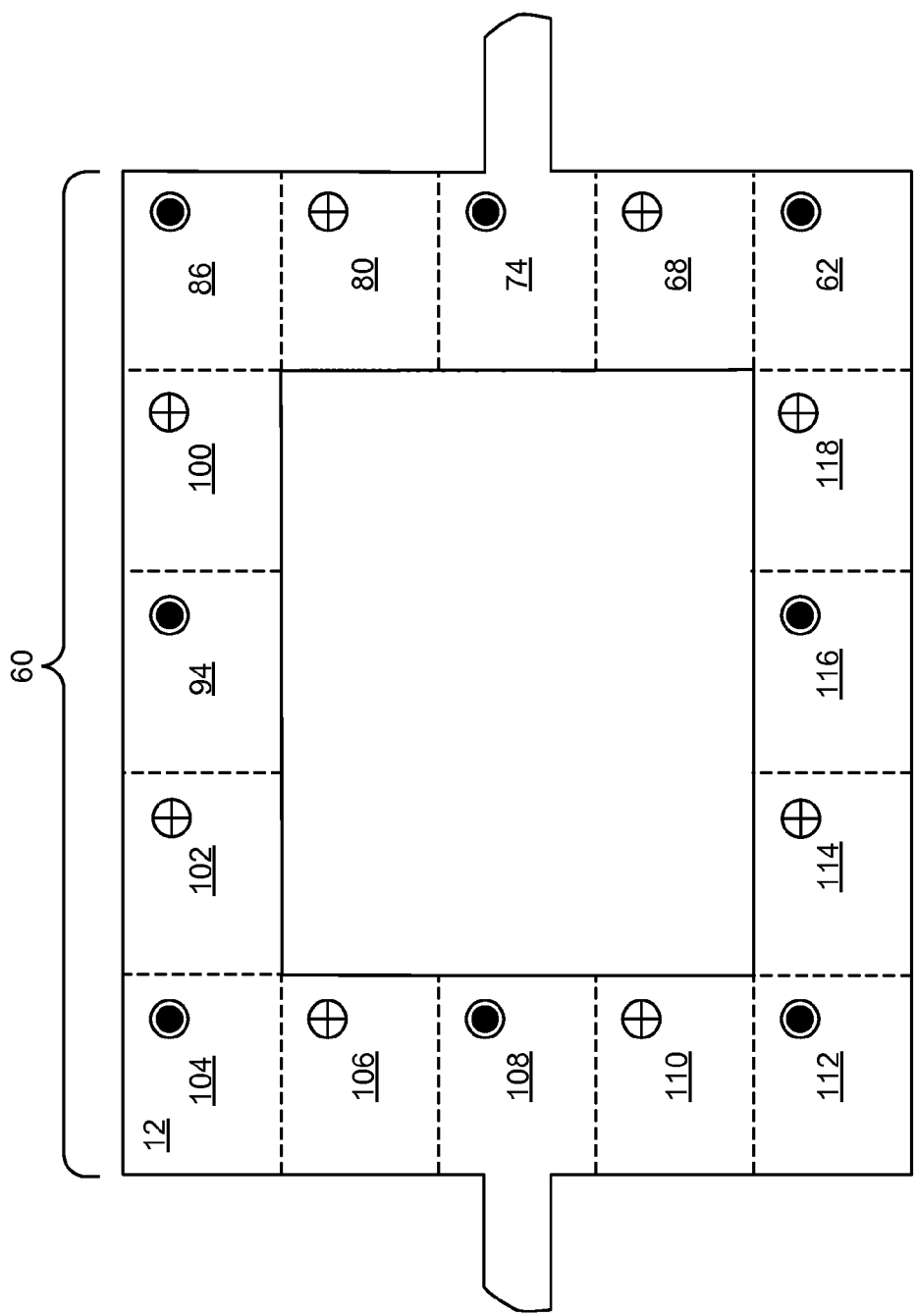

FIG. 19 shows a second cross-section of the rectangular ring-shaped single-port domain inversions based vibrating structure illustrated in FIG. 18, according to one embodiment of the rectangular ring-shaped single-port domain inversions based vibrating structure.

Figure 20:
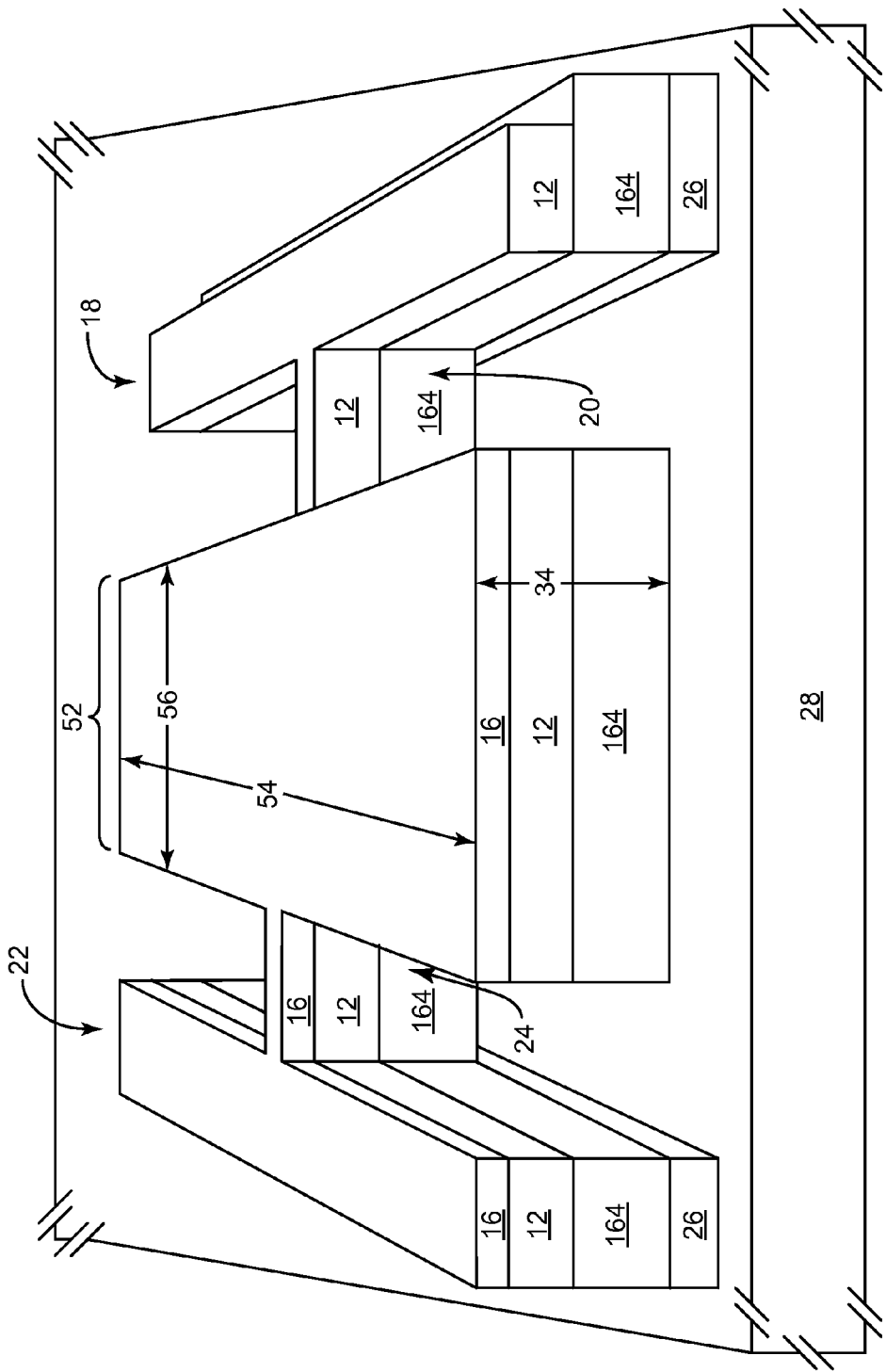

FIG. 20 shows a three-dimensional view of the rectangular-shaped single-port domain inversions based vibrating structure, according to an additional embodiment of the present invention.

Figure 21:
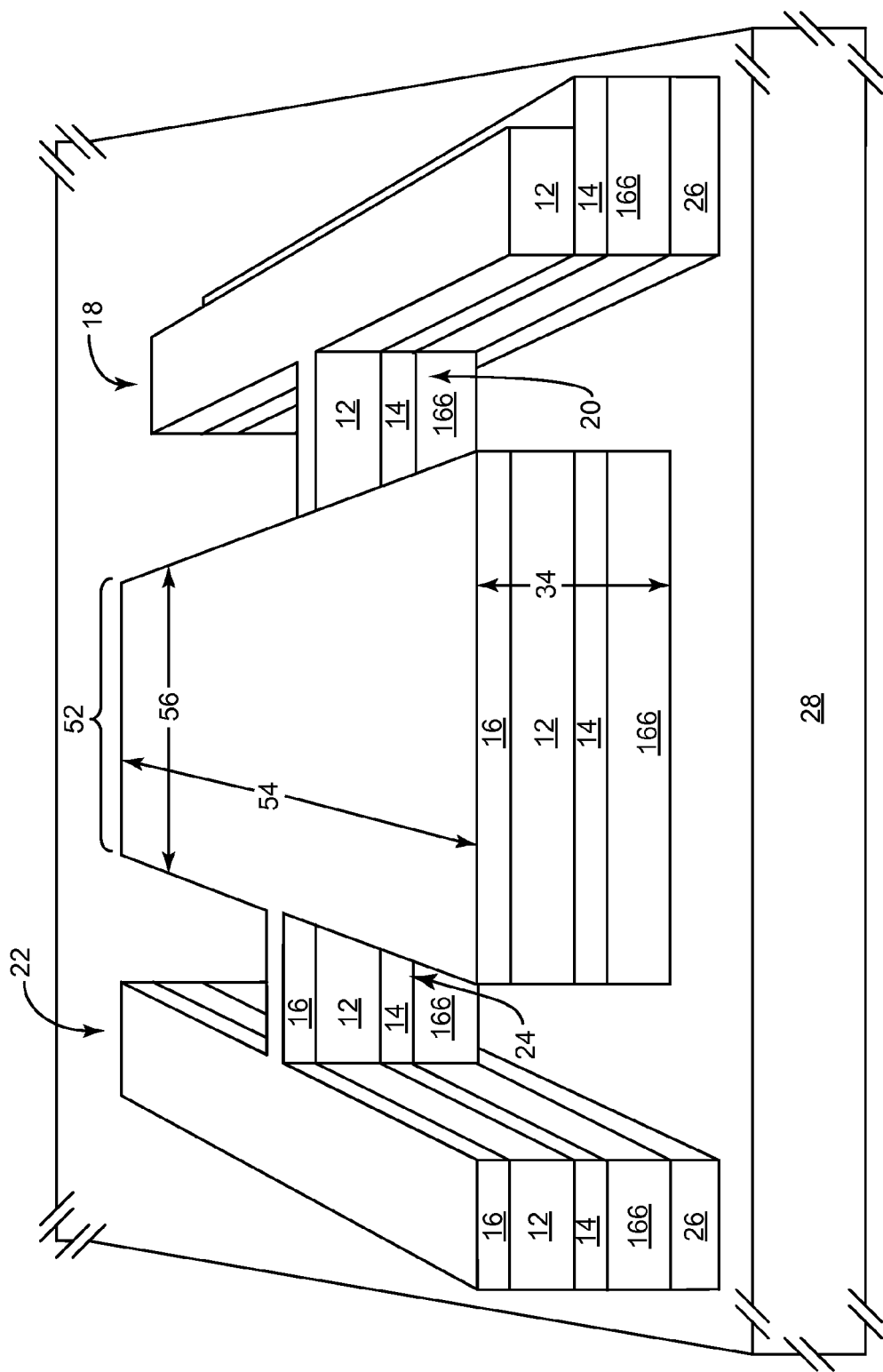

FIG. 21 shows a three-dimensional view of the rectangular-shaped single-port domain inversions based vibrating structure, according to another embodiment of the present invention.

Figure 22:
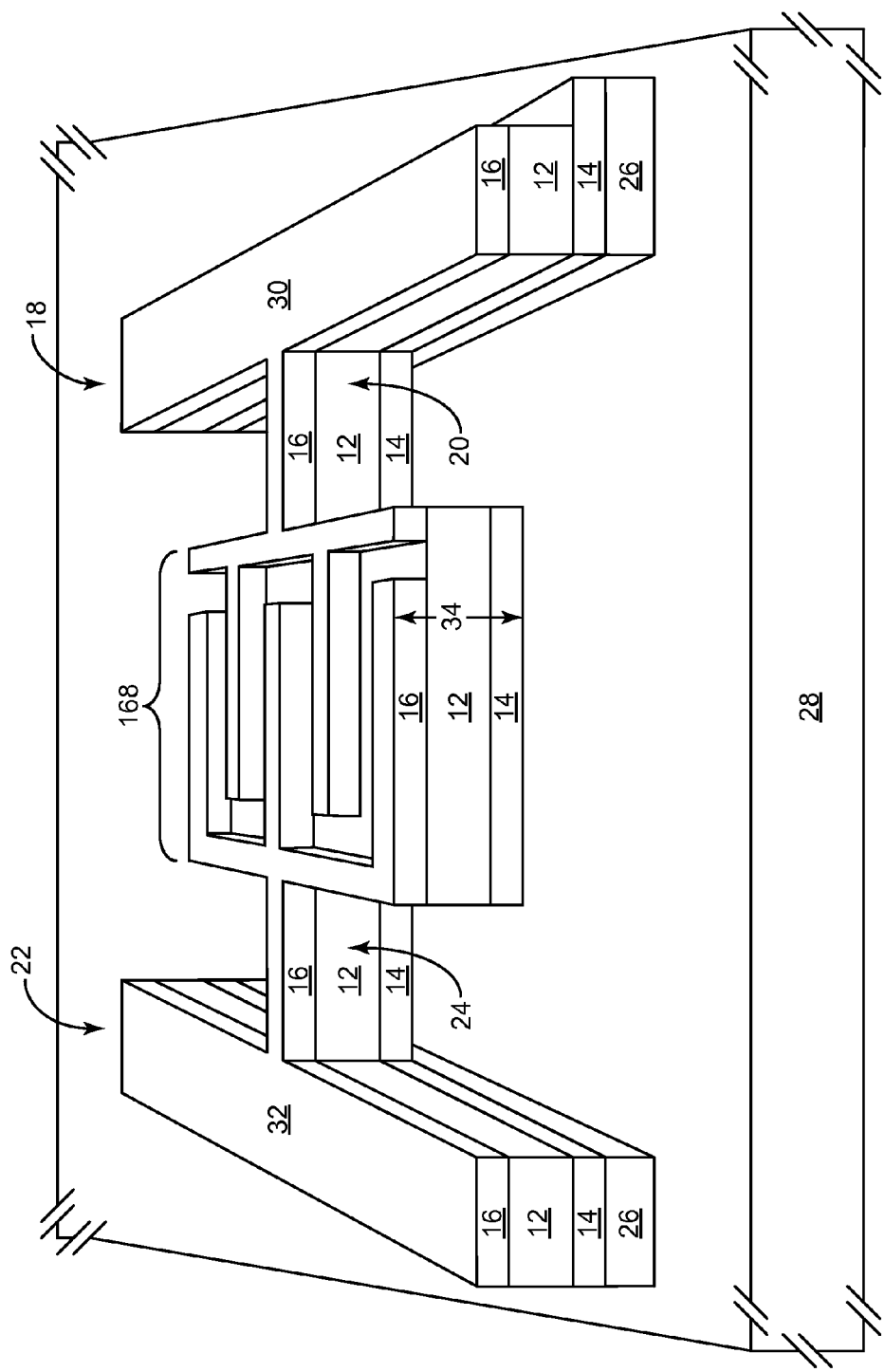

FIG. 22 shows a domain inversions based IDT MEMS vibrating structure, according to one embodiment of the present invention.

Figure 23:
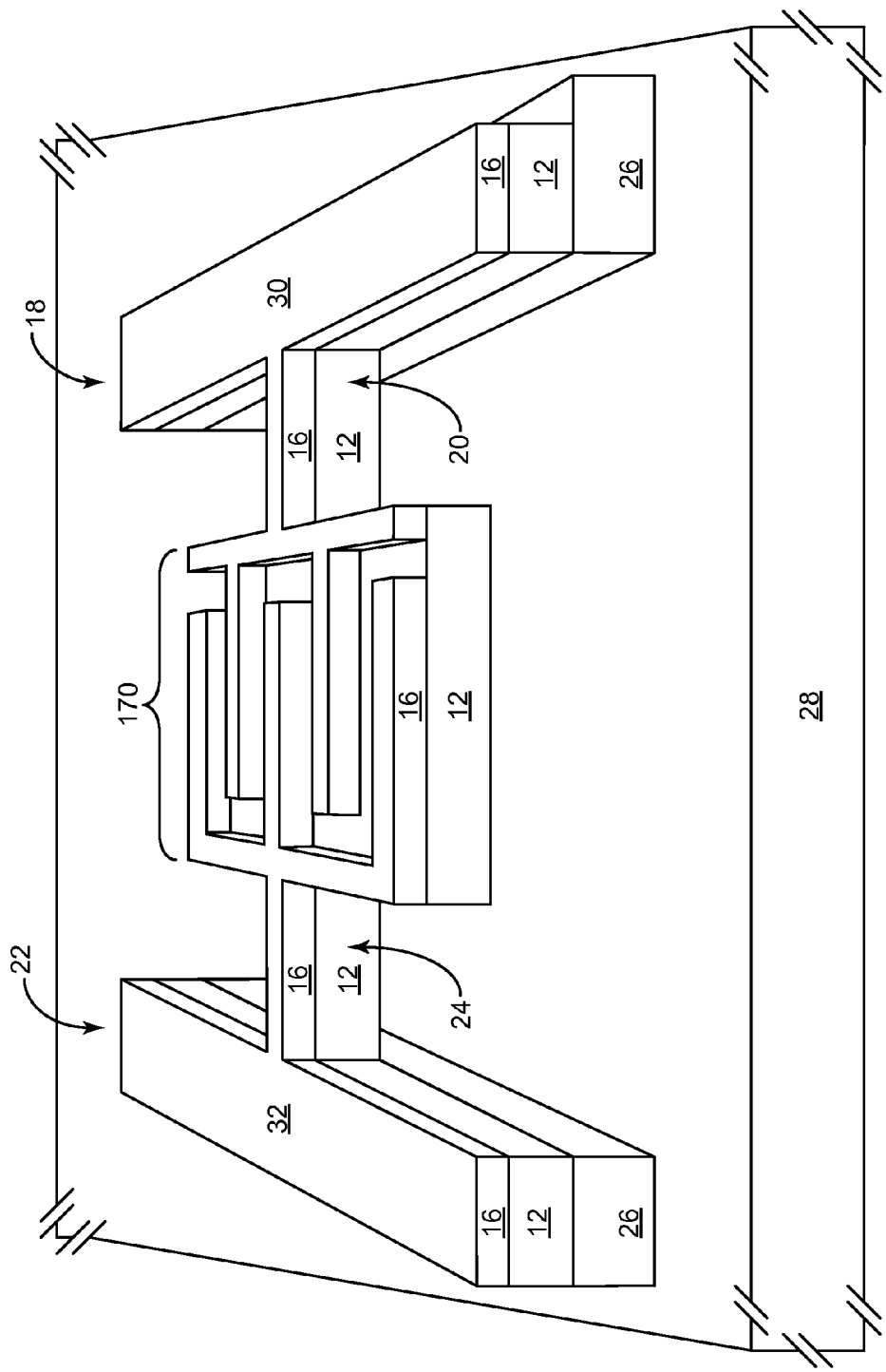

FIG. 23 shows a single conducting layer domain inversions based IDT MEMS vibrating structure, according to an alternate embodiment of the present invention.

Figure 24:
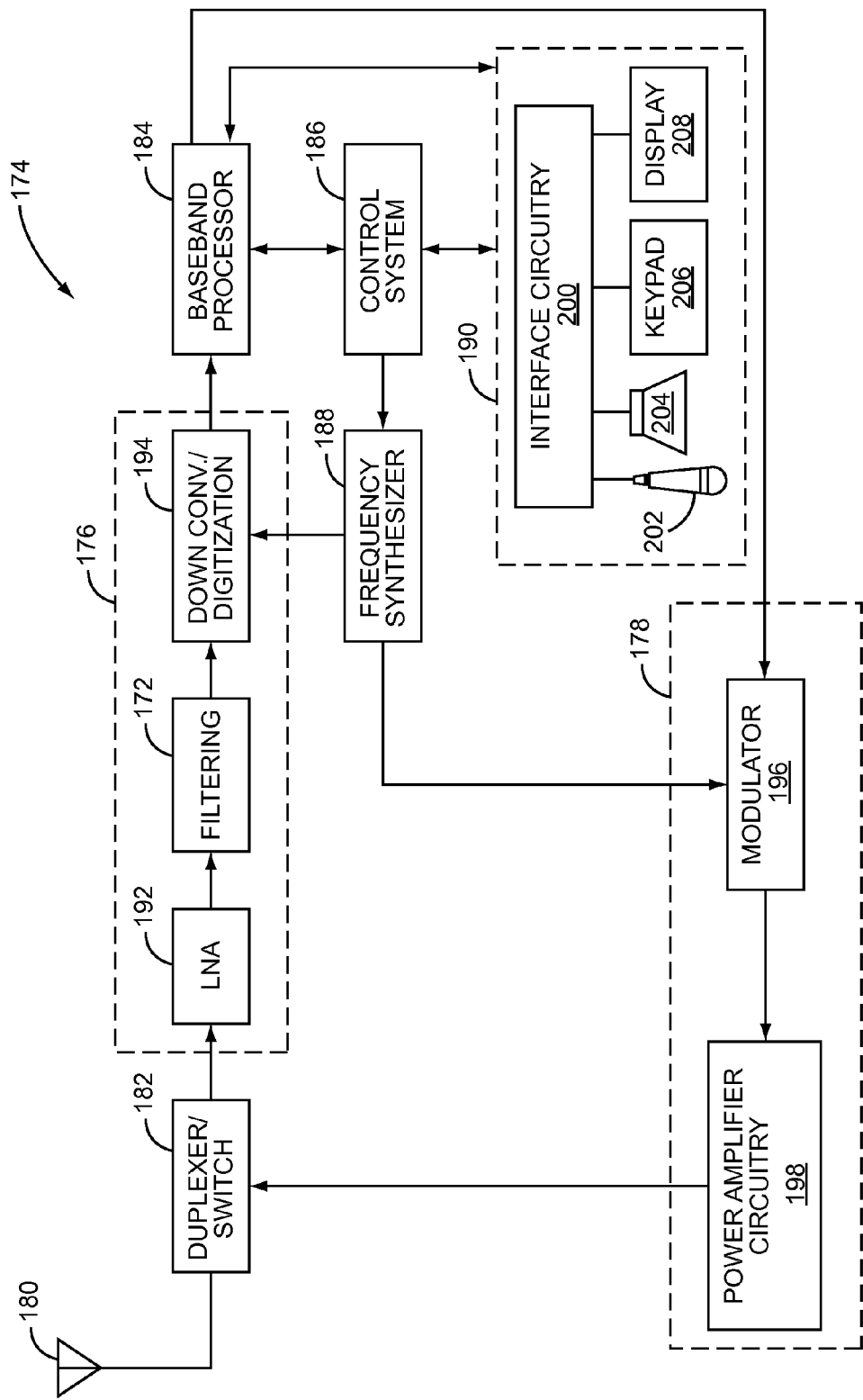

FIG. 24 shows an application example of the present invention used in a mobile terminal.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to a micro-electro-mechanical systems (MEMS) vibrating structure supported by a MEMS anchor system, and includes a single-crystal piezoelectric thin-film layer having domain inversions, which determine certain vibrational characteristics of the MEMS vibrating structure. The MEMS vibrating structure may have dominant lateral vibrations or dominant thickness vibrations. The single-crystal piezoelectric thin-film layer may include Lithium Tantalate or Lithium Niobate, and may provide MEMS vibrating structures with precise sizes and shapes, which may provide high accuracy and enable fabrication of multiple resonators having different resonant frequencies on a single substrate.

Since the MEMS vibrating structure is formed from a single-crystal material and uses mechanically efficient MEMS construction, the MEMS vibrating structure may be high-Q, low loss, stable, have a low temperature coefficient of frequency, have a high electromechanical coupling coefficient, have high repeatability, and have a low motional impedance. In one embodiment of the present invention, a non-standard crystalline orientation of the single-crystal piezoelectric thin-film may be used to provide specific vibrational characteristics, such as a low temperature coefficient of frequency, a high electromechanical coupling coefficient, or both.

The single-crystal piezoelectric thin-film layer has piezoelectric properties, such that an applied alternating current (AC) voltage may cause mechanical vibrations, and the single-crystal piezoelectric thin-film layer may include Lithium Tantalate or Lithium Niobate for their desirable properties. In one embodiment of the present invention, the single-crystal piezoelectric thin-film layer is sandwiched between two conductive layers, such as metallization layers, such that the single-crystal piezoelectric thin-film layer is a principal resonating layer and may provide the dominant resonant characteristics of the MEMS vibrating structure.

In an alternate embodiment of the present invention, the single-crystal piezoelectric thin-film layer is sandwiched between two conductive layers; however, one of the conductive layers is a principal resonating layer and may provide the dominant resonant characteristics of the MEMS vibrating structure, and the single-crystal piezoelectric thin-film layer may provide mechanical drive. For example, the conductive layer that is a principal resonating layer is a conductive single-crystal semiconductor layer, such as highly-doped Silicon, polysilicon, isotropic, or other materials, which may be significantly thicker than the single-crystal piezoelectric thin-film layer. Alternatively, both the single-crystal piezoelectric thin-film layer and one of the conductive layers may be principal resonating layers and both may contribute to dominant resonant characteristics of the MEMS vibrating structure.

In an additional embodiment of the present invention, the single-crystal piezoelectric thin-film layer is sandwiched between two conductive layers and one of the two conductive layers is sandwiched between the single-crystal piezoelectric thin-film layer and a single-crystal semiconductor layer. The single-crystal semiconductor layer may be conductive or semi-conductive, and may include highly-doped Silicon, doped Silicon, lightly-doped Silicon, non-doped Silicon, polysilicon, isotropic, or other materials. The single-crystal piezoelectric thin-film layer provides the mechanical drive and the single-crystal semiconductor layer, the single-crystal piezoelectric thin-film layer, or both, is a principal resonating layer, and may provide or contribute to the dominant resonant characteristics of the MEMS vibrating structure.

The single-crystal piezoelectric thin-film layer may be driven with an AC voltage to operate as a piezoelectric transducer, or may be additionally driven with a direct current (DC) voltage to operate additionally as an electrostatic transducer based on the capacitance established by the single-crystal piezoelectric thin-film layer sandwiched between two conductive layers. An electrostatic transducer requires both AC and DC voltages for proper operation.

Material that has the potential to become piezoelectric material may have a crystalline structure with randomly oriented dipoles. The material becomes piezoelectric material by substantially aligning the dipoles to form domains, such as Weiss domains. A domain is a region of piezoelectric material having a substantially uniform dipole orientation, which may be created by poling. Poling may include applying a strong poling electric field to a region of the material to substantially force the dipoles into alignment. When the electric field is removed, much of the alignment remains, thereby providing the piezoelectric properties of the poled material, which is called piezoelectric material.

A nominal poling electric field has a nominal poling orientation and may create a nominal domain having a nominal orientation, or nominal polarization. Similarly, an inverted poling electric field has an inverted poling orientation, which may be translated about 180 degrees from the nominal poling orientation, and may create an inverted domain having an inverted orientation, or inverted polarization. The inverted orientation may be translated about 180 degrees from the nominal orientation. Typically, a poling electric field may be about perpendicular to a surface of the single-crystal piezoelectric thin-film; however, typically the crystalline orientation of the single-crystal piezoelectric thin-film may not be perpendicular to the surface of the single-crystal piezoelectric thin-film. Therefore, the nominal orientation may or may not be parallel to the nominal poling orientation. Similarly, the inverted orientation may or may not be parallel to the inverted poling orientation. A piezoelectric material having domain inversions has at least one nominal domain adjacent to at least one inverted domain. When a uniform electric field is applied to a piezoelectric material having domain inversions, any nominal domains may move in one manner and any inverted domains may move in an opposite manner. For example, a nominal domain may expand and an inverted domain may shrink, or vice versa.

Crystals which acquire a charge when compressed, twisted, or distorted are said to be piezoelectric. This property provides a transducer effect between electrical and mechanical oscillations or vibrations. In a piezoelectric transducer, an applied AC voltage will cause mechanical vibrations in the transducer, which will present an impedance response to the circuitry providing the AC voltage that is dependent on mechanical resonances in the piezoelectric transducer. The impedance response may be called a motional impedance. Additionally, the piezoelectric transducer will present an impedance response, called an electrical impedance, to the circuitry providing the AC voltage that is based on the electrical characteristics of the piezoelectric transducer. The motional impedance and the electrical impedance combine to provide a total impedance presented to the circuitry providing the AC voltage.

An electrostatic transducer is similar to a piezoelectric transducer. In a piezoelectric transducer, charges in a piezoelectric material are produced from mechanical movements in the piezoelectric material. In an electrostatic transducer, charges in a dielectric material, which is enclosed on either side with conducting materials to form a capacitor, are produced from an applied DC voltage across the dielectric material. Mechanical vibrations in the electrostatic transducer will vary the capacitance of the transducer, which will present an impedance response to the circuitry providing the DC voltage across the dielectric material that is dependent on mechanical vibrations in the transducer.

If a piezoelectric transducer and an electrostatic transducer are combined into a single transducer using a common crystal material, then the single transducer will have a piezoelectric impedance that is dependent on mechanical and piezoelectric properties of the transducer and the frequency and magnitude of an AC voltage applied across the transducer, and an electrostatic impedance that is dependent on mechanical and electrical properties, such as a dielectric constant, of the transducer and the magnitude of a DC voltage applied across the transducer. The DC voltage may be varied to fine tune the piezoelectric impedance. Additionally, the DC voltage may be modulated with a low frequency signal that is effectively mixed with the AC voltage.

Figure 1:
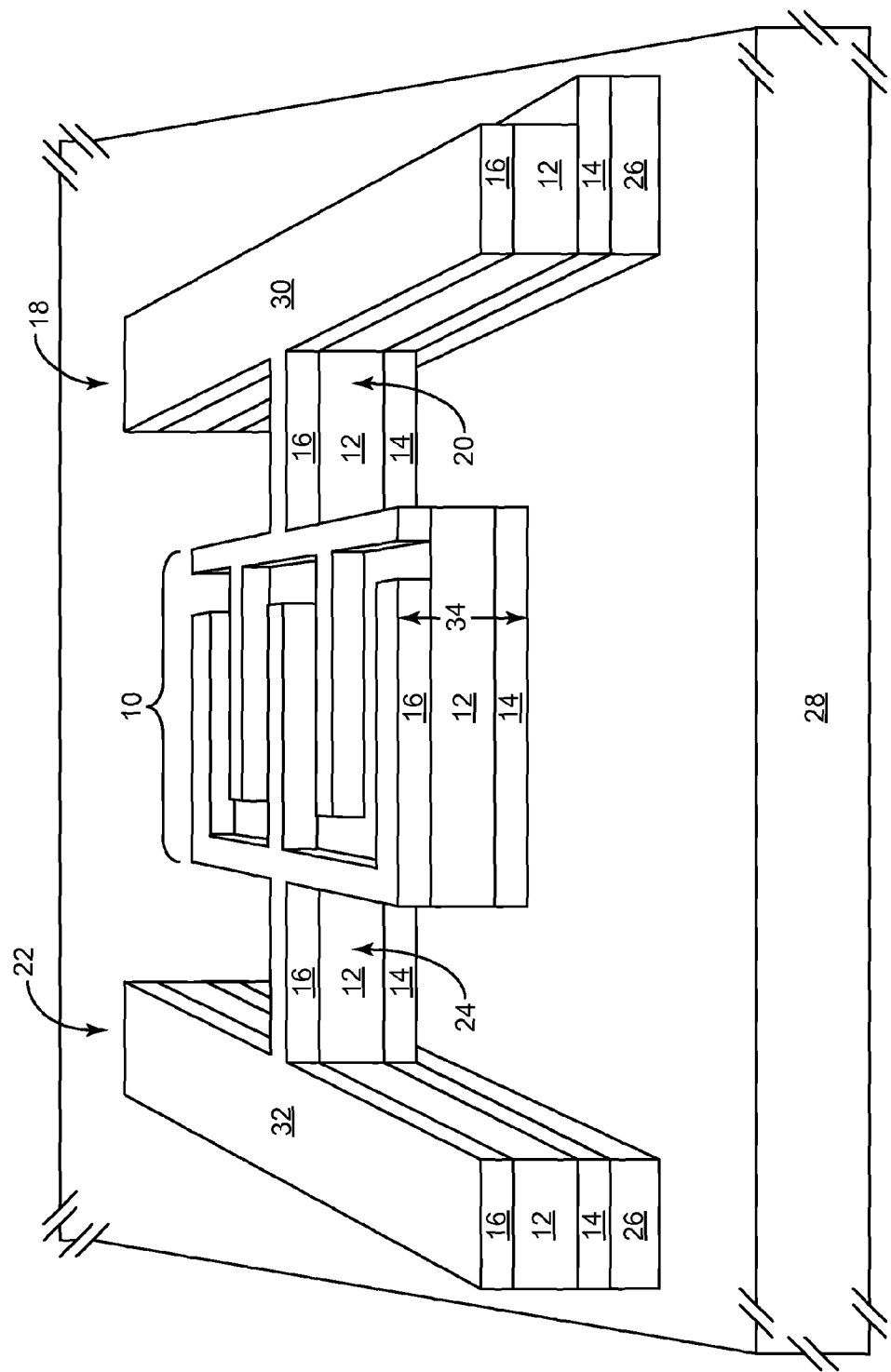
FIG. 1 shows a three-dimensional view of an inter-digital-transduced (IDT) micro-electro-mechanical systems (MEMS) vibrating structure, according to one embodiment of the present invention.

FIG. 1 shows a three-dimensional view of an inter-digital-transduced (IDT) MEMS vibrating structure 10, which is one example of a uniform domain MEMS vibrating structure, according to one embodiment of the present invention. A uniform domain MEMS vibrating structure does not include domain inversions; therefore, all of the domains are of similar orientation. The IDT MEMS vibrating structure 10 includes a single-crystal piezoelectric thin-film layer 12 that is sandwiched between a first conducting layer 14 and a second conducting layer 16. A first supporting structure includes a first anchor 18 and a first mechanical support member 20 between the IDT MEMS vibrating structure 10 and the first anchor 18. A second supporting structure includes a second anchor 22 and a second mechanical support member 24 between the IDT MEMS vibrating structure 10 and the second anchor 22. An insulating layer 26 is located over a substrate 28 and may be etched to provide attachment points for the first and second anchors 18, 22. The first and second supporting structures include the first and second conducting layers 14, 16 and the single-crystal piezoelectric thin-film layer 12. The IDT MEMS vibrating structure 10 is suspended between the first and second anchors 18, 22.

The second conducting layer 16 provides a first conducting section 30 on part of the first anchor 18, on the first mechanical support member 20, and on part of the IDT MEMS vibrating structure 10. The second conducting layer 16 provides a second conducting section 32 on the second anchor 22, on the second mechanical support member 24, and on part of the IDT MEMS vibrating structure 10. On the first anchor 18, the second conducting layer 16 and the single-crystal piezoelectric thin-film layer 12 may be etched away to provide an electrical connection to the first conducting layer 14. The first conducting layer 14, the first conducting section 30, and the second conducting section 32 may be electrically isolated from one another. The IDT MEMS vibrating structure 10 may be used to form an inter-digital transducer. In alternate embodiments of the present invention, the IDT MEMS vibrating structure 10 may be suspended between three or more anchors, or may be suspended from a single anchor.

Figure 2:
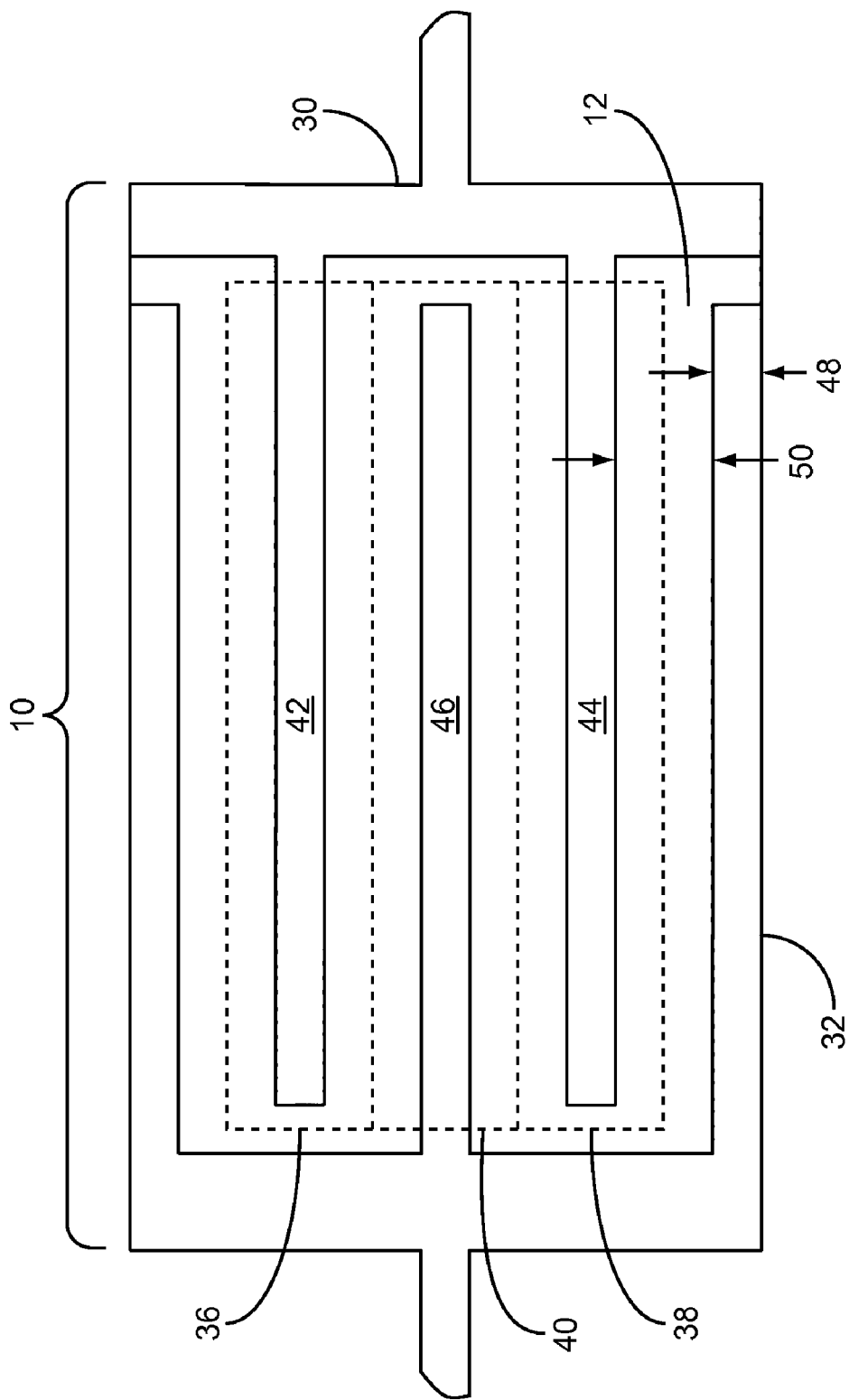
FIG. 2 shows a top view of the IDT MEMS vibrating structure illustrated in FIG. 1.

FIG. 2 shows a top view of the IDT MEMS vibrating structure 10 illustrated in FIG. 1. The first and second conducting sections 30, 32 segment the IDT MEMS vibrating structure 10 into a first segment 36, a second segment 38, and a third segment 40. Each of the first, second, and third segments 36, 38, 40 is rectangular in shape with the first conducting section 30 providing a first conducting finger 42 down the center of the first segment 36 and a second conducting finger 44 down the center of the second segment 38, and the second conducting section 32 providing a third conducting finger 46 down the center of the third segment 40. Each of the conducting fingers 42, 44, 46 has a finger width 48. Additionally, a finger spacing 50 is the isolation distance between any two of the conducting fingers 42, 44, 46. Normally, a first AC voltage is applied between the first conducting layer 14 and the first conducting section 30, and a second AC voltage, which is phase-shifted about 180 degrees from the first AC voltage, is applied between the first conducting layer 14 and the second conducting section 32. Therefore, the voltages surrounding the first and second segments 36, 38 are phase-shifted about 180 degrees from the voltage surrounding the third segment 40, which drives the first and second segments 36, 38 in directions that are opposite to the direction of the third segment 40.

For example, when the first and second segments 36, 38 are being driven to minimize the widths of the first and second segments 36, 38, the third segment 40 is being driven to maximize the width of the third segment 40, as illustrated in FIGS. 3A, 3B, and 3C. By sub-dividing the IDT MEMS vibrating structure 10 into segments, each segment may vibrate at a higher frequency than an un-segmented MEMS vibrating structure. The higher frequencies may be better suited for certain radio frequency (RF) applications. Alternate embodiments of the present invention may use an IDT MEMS vibrating structure 10 of any shape having any number of segments of any shape. The first and second AC voltages may be sinusoidal or may be periodic waveforms of any shape. In one embodiment of the present invention, the dominant mode of vibration is an IDT mode of vibration, which is one form of lateral vibration, wherein the widths of the first, second, and third segments 36, 38, 40 vary as the IDT MEMS vibrating structure 10 vibrates.

Nominal widths of the first, second, and third segments 36, 38, 40 are based on the finger spacing 50 and the finger width 48. Specifically, the nominal width may be about equal to the sum of the finger spacing 50 and the finger width 48. Therefore, the vibrational characteristics of the IDT MEMS vibrating structure 10 illustrated in FIG. 1 may be based primarily on the layout of the second conducting layer 16. Since the first conducting section 30 and the second conducting section 32 are driven using two different voltages, the IDT MEMS vibrating structure 10 illustrated in FIG. 1 is a two-port structure. In one embodiment of the present invention, the first conducting section 30 and the second conducting section 32 are driven using a differential AC signal, which includes a nominal signal and an inverted signal, which is phase-shifted about 180 degrees from the nominal signal.

An alternative to the IDT MEMS vibrating structure 10 illustrated in FIG. 1 is a single-port domain inversions based vibrating structure 52, according to an alternate embodiment of the present invention, as illustrated in FIG. 4. Whereas the IDT MEMS vibrating structure 10 illustrated in FIG. 1 uses the first, second, and third conducting fingers 42, 44, 46 to drive the first, second, and third segments 36, 38, 40, respectively, at higher frequencies than an un-segmented uniform domains MEMS vibrating structure, the single-port domain inversions based vibrating structure 52 can similarly provide higher vibrational frequencies than an un-segmented uniform domains MEMS vibrating structure.

The single-port domain inversions based vibrating structure 52 includes the single-crystal piezoelectric thin-film layer 12 having domain inversions sandwiched between the first conducting layer 14 and the second conducting layer 16. The first and second conducting layers 14, 16 provide lumped top and bottom electrodes above and below the single-crystal piezoelectric thin-film layer 12. By electrically driving the top and bottom electrodes, the domain inversions in the single-crystal piezoelectric thin-film layer 12 may facilitate high-order bulk modes, such as plate waves, which may provide high operating frequencies similar to the IDT MEMS vibrating structure 10 illustrated in FIG. 1. However, by using large surface area bulk electrodes instead of using comparatively long and thin conducting fingers 42, 44, 46, the single-port domain inversions based vibrating structure 52 may provide a higher transduction area, a lower electrode resistance, and higher power handling capability than a similarly shaped IDT MEMS vibrating structure 10. In one embodiment of the present invention, the dominant mode of vibration is an inverted domains mode of vibration, which is one form of lateral vibration, wherein plate waves are distributed across the single-port domain inversions based vibrating structure 52.

The single-port domain inversions based vibrating structure 52 illustrated in FIG. 4 is rectangular-shaped having an outer length 54 and an outer width 56. The first and second mechanical support members 20, 24 may be attached to the rectangular-shaped single-port domain inversions based vibrating structure 52 about midway along the outer length 54. Other embodiments of the present invention may have any number of mechanical support members. A first cross-section 58 of the single-port domain inversions based vibrating structure 52 is parallel with the outer length 54 looking toward the second mechanical support member 24. A second cross-section 60 of the single-crystal piezoelectric thin-film layer 12 of the single-port domain inversions based vibrating structure 52 is parallel with the outer width 56 looking toward the substrate 28.

FIG. 5 shows the first cross-section 58 of the rectangular-shaped single-port domain inversions based vibrating structure 52 illustrated in FIG. 4. The single-crystal piezoelectric thin-film layer 12 of the rectangular-shaped single-port domain inversions based vibrating structure 52 includes a first nominal domain 62 having a first nominal domain width 64 and a first nominal domain thickness 66, a first inverted domain 68 having a first inverted domain width 70 and a first inverted domain thickness 72, a second nominal domain 74 having a second nominal domain width 76 and a second nominal domain thickness 78, a second inverted domain 80 having a second inverted domain width 82 and a second inverted domain thickness 84, and a third nominal domain 86 having a third nominal domain width 88 and a third nominal domain thickness 90. The first inverted domain 68 is adjacent to the first nominal domain 62, the second nominal domain 74 is adjacent to the first inverted domain 68, the second inverted domain 80 is adjacent to the second nominal domain 74, and the third nominal domain 86 is adjacent to the second inverted domain 80.

The first, second, and third nominal domains 62, 74, 86 may be formed by poling the single-crystal piezoelectric thin-film layer 12 in the regions of the first, second, and third nominal domains 62, 74, 86 using a strong electric field having a nominal poling orientation. Similarly, the first and second inverted domains 68, 80 may be formed by poling the single-crystal piezoelectric thin-film layer 12 in the regions of the first and second inverted domains 68, 80 using a strong electric field having an inverted poling orientation, which may be translated from the nominal poling orientation by about 180 degrees. If the domain widths 64, 70, 76, 82, 88 are constant along the outer width 56 and are about equal to one another, then the single-port domain inversions based vibrating structure 52 is periodically-poled. If the domain widths 64, 70, 76, 82, 88 are not constant along the outer width 56, are not about equal to one another, or both, then the single-port domain inversions based vibrating structure 52 is non-periodically-poled. The orientations of the first, second, and third nominal domains 62, 74, 86 and the first and second inverted domains 68, 80 are illustrated in FIG. 5 as about perpendicular to the plane of the single-crystal piezoelectric thin-film layer 12. The nominal and inverted orientations may typically be tilted or not perpendicular to the plane of the single-crystal piezoelectric thin-film layer 12. The nominal and inverted orientations of the domains may be based on the crystal orientation of the single-crystal piezoelectric thin-film layer 12.

FIG. 6 shows the second cross-section 60 of the single-crystal piezoelectric thin-film layer 12 of the rectangular-shaped single-port domain inversions based vibrating structure 52 illustrated in FIG. 4, according to one embodiment of the rectangular-shaped single-port domain inversions based vibrating structure 52. The first inverted domain 68 is adjacent to the first nominal domain 62, the second nominal domain 74 is adjacent to the first inverted domain 68, the second inverted domain 80 is adjacent to the second nominal domain 74, and the third nominal domain 86 is adjacent to the second inverted domain 80. Since the domain widths 64, 70, 76, 82, 88 of the domains 62, 68, 74, 80, 86 are constant, the rectangular-shaped single-port domain inversions based vibrating structure 52 is periodically-poled along its outer length 54.

FIGS. 7A, 7B, 7C, 7D, and 7E are graphs illustrating how the first nominal domain width 64, the first inverted domain width 70, the second nominal domain width 76, the second inverted domain width 82, and the third nominal domain width 88, respectively, of the rectangular-shaped single-port domain inversions based vibrating structure 52 illustrated in FIG. 5 vary with time. In one embodiment of the present invention, when an AC voltage is applied between the first conducting layer 14 and the second conducting layer 16 of the rectangular-shaped single-port domain inversions based vibrating structure 52 (FIG. 5), the inverted domain widths 70, 82 increase as the nominal domain widths 64, 76, 88 decrease, and vice versa, due to the different piezoelectric response of the nominal domains 62, 74, 86 versus the inverted domains 68, 80, as illustrated in FIGS. 7A, 7B, 7C, 7D, and 7E. The vibrational characteristics of the rectangular-shaped single-port domain inversions based vibrating structure 52 may be based on the domain widths 64, 70, 76, 82, 88 of the domains 62, 68, 74, 80, 86. Since the domain widths 64, 70, 76, 82, 88 vary with time in the presence of an AC signal, the rectangular-shaped single-port domain inversions based vibrating structure 52 has dominant lateral vibrations, which may be width-extensional mode vibrations.

FIGS. 8A, 8B, 8C, 8D, and 8E are graphs illustrating how the first nominal domain thickness 66, the first inverted domain thickness 72, the second nominal domain thickness 78, the second inverted domain thickness 84, and the third nominal domain thickness 90, respectively, of the rectangular-shaped single-port domain inversions based vibrating structure 52 illustrated in FIG. 5 vary with time. In another embodiment of the present invention, when an AC voltage is applied between the first conducting layer 14 and the second conducting layer 16 of the rectangular-shaped single-port domain inversions based vibrating structure 52 (FIG. 5), the inverted domain thicknesses 72, 84 increase as the nominal domain thicknesses 66, 78, 90 decrease, and vice versa, due to the different piezoelectric response of the nominal domains 62, 74, 86 versus the inverted domains 68, 80, as illustrated in FIGS. 8A, 8B, 8C, 8D, and 8E. The vibrational characteristics of the rectangular-shaped single-port domain inversions based vibrating structure 52 may be based on the domain widths 64, 70, 76, 82, 88 of the domains 62, 68, 74, 80, 86, the domain thicknesses 66, 72, 78, 84, 90, or both. Since the domain thicknesses 66, 72, 78, 84, 90 vary with time in the presence of an AC signal, the rectangular-shaped single-port domain inversions based vibrating structure 52 has dominant thickness vibrations, which may be thickness-extensional mode vibrations. In an additional embodiment of the present invention, the rectangular-shaped single-port domain inversions based vibrating structure 52 has both dominant thickness vibrations and dominant lateral vibrations.

FIG. 9 shows a three-dimensional view of a rectangular-shaped dual-port domain inversions based vibrating structure 92, according to an additional embodiment of the present invention. The rectangular-shaped dual-port domain inversions based vibrating structure 92 is similar to the rectangular-shaped single-port domain inversions based vibrating structure 52 illustrated in FIG. 4, except the second conducting layer 16 of the rectangular-shaped dual-port domain inversions based vibrating structure 92 is divided into two sections. One section includes the second conducting layer 16 on part of the first anchor 18 and on the first mechanical support member 20 from the first conducting section 30. The other section includes the second conducting layer 16 on part of the second anchor 22 and on the second mechanical support member 24 form the second conducting section 32. Each of the two sections may reside on either end of the rectangular-shaped dual-port domain inversions based vibrating structure 92. Additionally, each of the two sections provides one of two ports associated with the rectangular-shaped dual-port domain inversions based vibrating structure 92. The first and second conducting sections 30, 32 are electrically isolated from one another.

In one embodiment of the present invention, a first AC voltage is applied between the first conducting layer 14 and the first conducting section 30, and a second AC voltage, which is phase-shifted about 180 degrees from the first AC voltage, is applied between the first conducting layer 14 and the second conducting section 32. The first and second AC voltages may be provided from a differential AC signal, which includes a nominal signal, which provides the first AC voltage and an inverted signal, which is phase-shifted about 180 degrees from the nominal signal to provide the second AC voltage.

FIG. 10 shows the first cross-section 58 of the rectangular-shaped dual-port domain inversions based vibrating structure 92 illustrated in FIG. 9 that is configured to work with differential signals, according to one embodiment of the rectangular-shaped dual-port domain inversions based vibrating structure 92, which is similar to the single-port domain inversions based vibrating structure 52 illustrated in FIG. 5, except for the addition of a fourth nominal domain 94 and splitting the second conducting layer 16 into two halves to provide two ports.

The single-crystal piezoelectric thin-film layer 12 of the rectangular-shaped dual-port domain inversions based vibrating structure 92 includes the first nominal domain 62 having the first nominal domain width 64 and the first nominal domain thickness 66, the first inverted domain 68 having the first inverted domain width 70 and the first inverted domain thickness 72, the second nominal domain 74 having the second nominal domain width 76 and the second nominal domain thickness 78, the second inverted domain 80 having the second inverted domain width 82 and the second inverted domain thickness 84, the third nominal domain 86 having the third nominal domain width 88 and the third nominal domain thickness 90, and the fourth nominal domain 94 having a fourth nominal domain width 96 and a fourth nominal domain thickness 98. The first inverted domain 68 is adjacent to the first nominal domain 62, the second nominal domain 74 is adjacent to the first inverted domain 68, the third nominal domain 86 is adjacent to the second nominal domain 74, the second inverted domain 80 is adjacent to the third nominal domain 86, and the fourth nominal domain 94 is adjacent to the second inverted domain 80.

The first nominal domain 62, the first inverted domain 68, and the second nominal domain 74 are between one half of the second conducting layer 16 and the first conducting layer 14. The third nominal domain 86, the second inverted domain 80, and the fourth nominal domain 94 are between the other half of the second conducting layer 16 and the first conducting layer 14. Therefore, when the first and second conducting sections 30, 32 are driven using a differential signal, each domain that produces a positive displacement is adjacent to a domain that produces a negative displacement, and vice versa. For example, when the first and second nominal domains 62, 74 are associated with a positive signal, which may produce a positive displacement, the third and fourth nominal domains 86, 94 are associated with a negative signal, which may produce a negative displacement, and vice versa. Similarly, when the first inverted domain 68 is associated with a positive signal, which may produce a negative displacement, the second inverted domain 80 is associated with a negative signal, which may produce a positive displacement, and vice versa. By locating the third nominal domain 86 adjacent to the second nominal domain 74, the third nominal domain 86 is associated with a positive signal when the second nominal domain 74 is associated with a negative signal, and vice versa. Therefore, each domain that produces a positive displacement is adjacent to a domain that produces a negative displacement, and vice versa.

FIGS. 11A, 11B, 11C, 11D, 11E, and 11F are graphs illustrating how the first nominal domain width 64, the first inverted domain width 70, the second nominal domain width 76, the third nominal domain width 88, the second inverted domain width 82, and the fourth nominal domain width 96, respectively, of the rectangular-shaped dual-port domain inversions based vibrating structure 92 illustrated in FIG. 10 vary with time. When the first and second conducting sections 30, 32 of the rectangular-shaped dual-port domain inversions based vibrating structure 92 (FIG. 10) are driven using a differential signal, the first and second nominal domain widths 64, 76 and the second inverted domain width 82 increase as the first inverted domain width 70 and the third and fourth nominal domain widths 88, 96 decrease, and vice versa, due to the different piezoelectric responses of the of the domains 62, 68, 74, 86, 80, 94, as illustrated in FIGS. 11A, 11B, 11C, 11D, 11E, and 11F. The vibrational characteristics of the rectangular-shaped dual-port domain inversions based vibrating structure 92 may be based on the domain widths 64, 70, 76, 88, 82, 96 of the domains 62, 68, 74, 86, 80, 94. Since the domain widths 64, 70, 76, 88, 82, 96 vary with time in the presence of a differential AC signal, the rectangular-shaped dual-port domain inversions based vibrating structure 92 has dominant lateral vibrations, which may be length-extensional mode vibrations.

FIG. 12 shows the second cross-section 60 of the rectangular-shaped single-port domain inversions based vibrating structure 52 illustrated in FIG. 4, according to an alternate embodiment of the rectangular-shaped single-port domain inversions based vibrating structure 52. The rectangular-shaped single-port domain inversions based vibrating structure 52 illustrated in FIG. 12 is similar to the rectangular-shaped single-port domain inversions based vibrating structure 52 illustrated in FIG. 6, except the rectangular-shaped single-port domain inversions based vibrating structure 52 illustrated in FIG. 6 is periodically-poled along its outer length 54, while the rectangular-shaped single-port domain inversions based vibrating structure 52 illustrated in FIG. 12 is periodically-poled along its outer length 54 and along its outer width 56 to form a checkerboard pattern. Specifically, the rectangular-shaped single-port domain inversions based vibrating structure 52 illustrated in FIG. 12 includes the first, second, third, and fourth nominal domains 62, 74, 86, 94, the first and second inverted domains 68, 80, third and fourth inverted domains 100, 102, fifth nominal and inverted domains 104, 106, sixth nominal and inverted domains 108, 110, seventh nominal and inverted domains 112, 114, eighth nominal and inverted domains 116, 118, ninth nominal and inverted domains 120, 122, tenth nominal and inverted domains 124, 126, eleventh nominal and inverted domains 128, 130, twelfth nominal and inverted domains 132, 134, and a thirteenth nominal domain 136.

The rows of domains along the outer width 56 include a first domain length 138, a second domain length 140, a third domain length 142, a fourth domain length 144, and a fifth domain length 146. Since the domain lengths 138, 140, 142, 144, 146 are about equal to one another and the domain widths 64, 70, 76, 82, 88 are about equal to one another, the rectangular-shaped single-port domain inversions based vibrating structure 52 illustrated in FIG. 12 is periodically-poled. The nominal domains and the inverting domains may be arranged such that each nominal domain is adjacent to only inverting domains and vice versa.

FIG. 13 shows the second cross-section 60 of the rectangular-shaped single-port domain inversions based vibrating structure 52 illustrated in FIG. 4, according to an additional embodiment of the rectangular-shaped single-port domain inversions based vibrating structure 52. The rectangular-shaped single-port domain inversions based vibrating structure 52 illustrated in FIG. 13 is similar to the rectangular-shaped single-port domain inversions based vibrating structure 52 illustrated in FIG. 12, except the rectangular-shaped single-port domain inversions based vibrating structure 52 illustrated in FIG. 12 has domain lengths 138, 140, 142, 144, 146 that are about equal to one another, while the rectangular-shaped single-port domain inversions based vibrating structure 52 illustrated in FIG. 13 has domain lengths 138, 140, 142, 144, 146 that are not equal to one another. Therefore, the rectangular-shaped single-port domain inversions based vibrating structure 52 illustrated in FIG. 13 is non-periodically-poled. By using different domain lengths, vibrational characteristics may be altered. For example, an RF filter formed using the rectangular-shaped single-port domain inversions based vibrating structure 52 illustrated in FIG. 13 may have a wider bandwidth than the rectangular-shaped single-port domain inversions based vibrating structure 52 illustrated in FIG. 12.

FIG. 14 shows a nominal domain poling structure superimposed over the second cross-section 60 of the rectangular-shaped single-port domain inversions based vibrating structure 52 illustrated in FIG. 6. The nominal domain poling structure includes nominal domain poling fingers 148 having the finger width 48 and the finger spacing 50. The sum of the finger width 48 and the finger spacing 50 is about equal to two times the domain width (FIG. 5). However, the sum of the finger width 48 and the finger spacing 50 of the IDT MEMS vibrating structure 10 is about equal to the width of one of the segments 36, 38, 40 of the IDT MEMS vibrating structure 10 illustrated in FIG. 2. Since a single-port domain inversions based vibrating structure 52 having a domain width about equal to a width of one of the segments 36, 38, 40 of the IDT MEMS vibrating structure 10 (FIG. 2) may have similar vibrational characteristics as the IDT MEMS vibrating structure 10, domain inversions based vibrating structures may operate at higher vibrational frequencies or have less stringent layout constraints as IDT MEMS vibrating structures 10.

FIG. 15 shows an inverted domain poling structure superimposed over the second cross-section 60 of the rectangular-shaped single-port domain inversions based vibrating structure 52 illustrated in FIG. 6. The inverted domain poling structure is similar to the nominal domain poling structure Illustrated in FIG. 14 and includes inverted domain poling fingers 150 having the finger width 48 and the finger spacing 50.

FIG. 16 shows a three-dimensional view of a trapezoidal-shaped single-port domain inversions based vibrating structure 52, according to another embodiment of the present invention. The trapezoidal-shaped single-port domain inversions based vibrating structure 52 is similar to the rectangular-shaped single-port domain inversions based vibrating structure 52 illustrated in FIG. 4, except instead of having a constant outer length 54, the trapezoidal-shaped single-port domain inversions based vibrating structure 52 has a short-side length 152 and a long-side length 154.

FIG. 17 shows the second cross-section 60 of the trapezoidal-shaped single-port domain inversions based vibrating structure 52 illustrated in FIG. 16, according to one embodiment of the trapezoidal-shaped single-port domain inversions based vibrating structure 52. The first inverted domain 68 is adjacent to the first nominal domain 62, the second nominal domain 74 is adjacent to the first inverted domain 68, the second inverted domain 80 is adjacent to the second nominal domain 74, and the third nominal domain 86 is adjacent to the second inverted domain 80. On the long-side of the trapezoidal-shaped single-port domain inversions based vibrating structure 52, each of the domains 62, 68, 74, 80, 86 has a long-side domain width 156. On the short-side of the trapezoidal-shaped single-port domain inversions based vibrating structure 52, each of the domains 62, 68, 74, 80, 86 has a short-side domain width 158, which is shorter than the long-side domain width 156. Therefore, since the domain width of each of the domains 62, 68, 74, 80, 86 is not constant, the trapezoidal-shaped single-port domain inversions based vibrating structure 52 is non-periodically-poled, and the trapezoidal-shaped single-port domain inversions based vibrating structure 52 may have a wider bandwidth than the periodically-poled rectangular-shaped single-port domain inversions based vibrating structure 52 illustrated in FIG. 6.

FIG. 18 shows a three-dimensional view of a rectangular ring-shaped single-port domain inversions based vibrating structure 52, according to a supplemental embodiment of the present invention. The rectangular ring-shaped single-port domain inversions based vibrating structure 52 is similar to the rectangular-shaped single-port domain inversions based vibrating structure 52 illustrated in FIG. 4, except in addition to having the outer length 54 and the outer width 56, the rectangular ring-shaped single-port domain inversions based vibrating structure 52 has an inner width 160 and an inner length 162, such that the area inside the inner width 160 and the inner length 162 is left open.

FIG. 19 shows the second cross-section 60 of the rectangular ring-shaped single-port domain inversions based vibrating structure 52 illustrated in FIG. 18, according to one embodiment of the rectangular ring-shaped single-port domain inversions based vibrating structure 52. The rectangular ring-shaped single-port domain inversions based vibrating structure 52 includes the first, second, third, fourth, fifth, sixth, seventh, and eighth nominal domains 62, 74, 86, 94, 104, 108, 112, 116, and the first, second, third, fourth, fifth, sixth, seventh, and eighth inverted domains 68, 80, 100, 102, 106, 110, 114, 118. The domains may be distributed around the perimeter of the rectangular ring-shaped single-port domain inversions based vibrating structure 52. The nominal domains and the inverting domains may be arranged such that each nominal domain is adjacent to only inverting domains and vice versa. The rectangular ring-shaped single-port domain inversions based vibrating structure 52 may be periodically-poled or non-periodically-poled.

Alternate embodiments of the present invention may have a vibrational structure of any shape, such as a disk, a square, a sphere, or the like, having any length, width, thickness, diameter, arc, chord, segment, or the like, and having any number of domain inversions, each of which may have any length, width, thickness, diameter, arc, chord, segment, or the like.

FIG. 20 shows a three-dimensional view of the rectangular-shaped single-port domain inversions based vibrating structure 52, according to an additional embodiment of the present invention. The rectangular-shaped single-port domain inversions based vibrating structure 52 illustrated in FIG. 20 is similar to the rectangular-shaped single-port domain inversions based vibrating structure 52 illustrated in FIG. 4 except that the first conducting layer 14 is replaced with a conducting resonating layer 164, which is conducting according to one embodiment of the present invention.

In FIG. 4, the grown single-crystal piezoelectric thin-film layer 12 provides most of the mechanical support in the first and second mechanical support members 20, 24, whereas in FIG. 20, the conducting resonating layer 164 may provide most of the mechanical support in the first and second mechanical support members 20, 24. The conducting resonating layer 164 may be the principal resonating layer and may provide the dominant resonant characteristics of the rectangular-shaped single-port domain inversions based vibrating structure 52. The conducting resonating layer 164 may be a single-crystal semiconductor layer, such as highly-doped Silicon. Alternatively, the conducting resonating layer 164 may include polysilicon, isotropic, or other materials. The conducting resonating layer 164 may be thick when compared with the grown single-crystal piezoelectric thin-film layer 12. For example, in an exemplary embodiment of the present invention, the thickness of the conducting resonating layer 164 may be less than about ten micro-meters, whereas the thickness of the grown single-crystal piezoelectric thin-film layer 12 may be less than about 0.1 micrometers. The grown single-crystal piezoelectric thin-film layer 12 serves as a driving transducer, whereas the conducting resonating layer 164 may provide a structural film and serve as the primary vibrating resonant structure. Such a MEMS vibrating structure may take advantage of the benefits of single-crystal Silicon, which may include high stability, high-Q, high linearity, low loss, and high acoustic-velocity.

The grown single-crystal piezoelectric thin-film layer 12 may function as both a piezoelectric transducer and an electrostatic transducer. The piezoelectric transducer responds to the driving AC voltage between the conducting resonating layer 164 and the second conducting layer 16 by generating lateral vibrations in the grown single-crystal piezoelectric thin-film layer 12, which may mechanically couple the lateral vibrations to the conducting resonating layer 164. The lateral vibrations may be caused by a piezoelectric effect produced by the driving AC voltage. The piezoelectric effect may present a piezoelectric impedance between the conducting resonating layer 164 and the second conducting layer 16. The electrostatic transducer responds to a DC voltage together with AC voltage applied between the conducting resonating layer 164 and the second conducting layers 16 and lateral vibrations in the grown single-crystal piezoelectric thin-film layer 12. The lateral vibrations and the DC voltage may produce an electrostatic effect, which may present an electrostatic impedance between the conducting resonating layer 164 and the second conducting layer 16. An electrostatic force may be about proportional to a product of the AC voltage and the DC voltage.

The thinness of the grown single-crystal piezoelectric thin-film layer 12 when compared with the thickness of the conducting resonating layer 164 may allow a very high density electric field for a given applied DC voltage. This very high density electric field combined with the stiffness and piezoelectric constants enabled by the mechanical coupling of the grown single-crystal piezoelectric thin-film layer 12 to the conducting resonating layer 164 may produce previously unrealizable interactions between a combined piezoelectric transducer and electrostatic transducer.

The grown single-crystal piezoelectric thin-film layer 12 is a single-crystal layer that may have been cut from a wafer that was grown with a specific crystal orientation. Additionally, the conducting resonating layer 164 may be a single-crystal layer that may have been cut from a wafer that was grown with a specific crystal orientation. The wafer cuts, such as a Z-cut or a rotated Y-cut, the shapes, and the thicknesses of the grown single-crystal piezoelectric thin-film layer 12 and the conducting resonating layer 164 in the MEMS vibrating structure may determine the vibrational characteristics of the MEMS vibrating structure. The wafer materials also may determine vibrational characteristics. Different vibrational characteristics may be used for different applications, such as sensors, resonators, oscillators, or filters.

FIG. 21 shows a three-dimensional view of the rectangular-shaped single-port domain inversions based vibrating structure 52, according to another embodiment of the present invention. The rectangular-shaped single-port domain inversions based vibrating structure 52 illustrated in FIG. 21 is similar to the rectangular-shaped single-port domain inversions based vibrating structure 52 illustrated in FIG. 20 except that the conducting resonating layer 164 is replaced with a supplemental resonating layer 166 and the first conducting layer 14 is included between the supplemental resonating layer 166 and the single-crystal piezoelectric thin-film layer 12 to provide conducting properties needed for the single-crystal piezoelectric thin-film layer 12 to function properly. The supplemental resonating layer 166 may be highly conductive, conductive, semi-conductive, or insulating, such as Silicon or dielectric material, and may provide vibrational characteristics similar to the conducting resonating layer 164 illustrated in FIG. 20.

FIG. 22 shows a domain inversions based IDT MEMS vibrating structure 168, according to one embodiment of the present invention. The domain inversions based IDT MEMS vibrating structure 168 is similar to the IDT MEMS vibrating structure 10 illustrated in FIG. 1, except the single-crystal piezoelectric thin-film layer 12 illustrated in FIG. 1 has only nominally oriented dipoles, whereas the single-crystal piezoelectric thin-film layer 12 illustrated in FIG. 22 has domain inversions and includes both nominally oriented dipoles and inversion oriented dipoles. The single-crystal piezoelectric thin-film layer 12 may have domain inversions along an outer length 54 as illustrated in FIG. 6 or FIG. 17, or along the outer length 54 and an outer width 56 as illustrated in FIG. 12 or FIG. 13. The single-crystal piezoelectric thin-film layer 12 may be periodically-poled or non-periodically-poled. The domain inversions based IDT MEMS vibrating structure 168 may be any shape.

FIG. 23 shows a single conducting layer domain inversions based IDT MEMS vibrating structure 170, according to an alternate embodiment of the present invention. The single conducting layer domain inversions based IDT MEMS vibrating structure 170 illustrated in FIG. 23 is similar to the domain inversions based IDT MEMS vibrating structure 168 illustrated in FIG. 22, except the single conducting layer domain inversions based IDT MEMS vibrating structure 170 illustrated in FIG. 23 does not have the first conducting layer 14 and the piezoelectric effect is produced by applying a driving AC voltage between the first conducting section 30 and the second conducting section 32.

The single-crystal piezoelectric thin-film layer 12 may have domain inversions along an outer length 54 as illustrated in FIG. 6 or FIG. 17, or along the outer length 54 and an outer width 56 as illustrated in FIG. 12 or FIG. 13. The single-crystal piezoelectric thin-film layer 12 may be periodically-poled or non-periodically-poled. The single conducting layer domain inversions based IDT MEMS vibrating structure 170 may be any shape.

The IDT MEMS vibrating structure 10 (FIG. 1), the single-port domain inversions based vibrating structure 52 (FIGS. 4, 16, 18, 20, and 21), and the rectangular-shaped dual-port domain inversions based vibrating structure 92 (FIG. 9) are all representative of a MEMS vibrating structure, which may include any or all of the characteristics presented below. The single-crystal piezoelectric thin-film layer 12 may have been cut from a boule that was grown with a specific uniform crystal orientation. The wafer cut, such as a Z-cut, a Y-cut, or any rotated cut, the shape, and the thickness of the single-crystal piezoelectric thin-film layer 12 in the MEMS vibrating structure determine a uniform crystalline orientation of the single-crystal piezoelectric thin-film layer 12 in the MEMS vibrating structure, which may determine the vibrational characteristics of the MEMS vibrating structure. Additionally, the wafer material, such as Lithium Tantalate or Lithium Niobate, may determine the vibrational characteristics of the MEMS vibrating structure. Different vibrational characteristics may be used for different applications, such as resonators, oscillators, filters, or sensors.

The crystalline orientation of the single-crystal piezoelectric thin-film layer 12 may be selected to provide at least one defined characteristic of the MEMS vibrating structure. Defined characteristics of the MEMS vibrating structure may include a minimized temperature coefficient of frequency of the MEMS vibrating structure, a temperature coefficient of frequency of the MEMS vibrating structure below an acceptance threshold, a maximized electromechanical coupling coefficient of the MEMS vibrating structure, an electromechanical coupling coefficient of the MEMS vibrating structure above an acceptance threshold, a maximized electromechanical coupling coefficient of the MEMS vibrating structure to provide a maximized bandwidth of the MEMS vibrating structure, an electromechanical coupling coefficient of the vibrating structure to provide a bandwidth of the MEMS vibrating structure above an acceptance threshold, or any combination thereof.

The maximized bandwidth, the bandwidth above an acceptance threshold, the acceptance threshold, or any combination thereof, may be expressed as an absolute bandwidth, such as kilohertz or megahertz, or as a relative bandwidth, such as a percentage or ratio of an absolute bandwidth divided by a frequency. For example, a MEMS vibrating structure may be used to form a bandpass filter requiring a minimum of a one percent passband; therefore, the acceptance threshold would be one percent. If the bandpass filter had a one gigahertz center frequency, then the bandwidth of the bandpass filter would need to be at least ten megahertz.

One vibrational characteristic is resonant frequency. The single-crystal piezoelectric thin-film layer 12 in a MEMS vibrating structure may have at least one resonant region having at least one resonant frequency. Another vibrational characteristic is the electromechanical coupling coefficient, which relates the mechanical characteristics to the electrical characteristics of the MEMS vibrating structure, and may be useful for radio frequency (RF) filter applications or high-Q RF circuits. An additional vibrational characteristic is the dominant mode of vibration.

In one embodiment of the present invention, during a first active state, the MEMS vibrating structure vibrates with dominant lateral mode vibrations or dominant thickness mode vibrations. Other vibrations may exist, but one vibrating mode will dominate. In other embodiments of the present invention, the MEMS vibrating structure may be of any shape having any of the aforementioned vibrating modes. The MEMS vibrating structure may be supported by any number of mechanical support members from any number of anchors. The mechanical support members may be attached to the MEMS vibrating structure at any location.

The first active state is entered by applying a driving AC voltage between the first conducting layer 14 and the second conducting layer 16 at the MEMS vibrating structure. The dominant vibrations may be caused by a piezoelectric effect produced by the driving AC voltage. A first inactive state exists when no driving AC voltage is applied. Typically, the driving AC voltage may be applied to the first conducting layer 14 on the first anchor 18, which is electrically attached to the first conducting layer 14 on the MEMS vibrating structure through the first conducting layer 14 on the corresponding mechanical support member 20, 24. Likewise, the driving AC voltage may be applied to the second conducting layer 16 on the second anchor 22, which is electrically attached to the second conducting layer 16 on the MEMS vibrating structure through the second conducting layer 16 on the second mechanical support member 24. Alternate embodiments of the present invention may use other mechanisms for coupling the driving AC signal to the MEMS vibrating structure, such as wire bonding. The driving AC signal may be sinusoidal or may be a periodic waveform of any shape. In alternate embodiments of the present invention, the MEMS vibrating structure may be of any shape.

The first conducting layer 14 may be a metallization layer, which may include Chromium or other metal, and the second conducting layer 16 may be a metallization layer, which may include Chromium or other metal. The thickness of the single-crystal piezoelectric thin-film layer 12 in the MEMS vibrating structure may be less than about ten micro-meters. In a first exemplary embodiment of the present invention, the thickness of the single-crystal piezoelectric thin-film layer 12 in the MEMS vibrating structure may be less than about one micro-meter.

The single-crystal piezoelectric thin-film layer 12 in the MEMS vibrating structure may include Lithium Tantalate, Lithium Niobate, Quartz, Langasite, Langanate, Langatate, Potassium Niobate, or any combination thereof. The substrate 28 may include Lithium Tantalate, Lithium Niobate, Quartz, Silicon, Gallium Arsenide, Langasite, Langanate, Langatate, Potassium Niobate, or any combination thereof. A motional impedance presented between the first and second conducting layers 14, 16 may be less than about 100 ohms at a first frequency. In an exemplary embodiment of the present invention, the motional impedance presented between the first and second conducting layers 14, 16 may be less than about 50 ohms at a first frequency. In alternate embodiments of the present invention, the body of the MEMS vibrating structure may include the single-crystal piezoelectric thin-film layer 12 and one or more additional layers of any material in any arrangement.

In an exemplary embodiment of the present invention, a system may include a substrate having a substrate surface, an anchor system having at least one anchor on the substrate surface, and a MEMS vibrating structure, which may include a body suspended from the anchor system. The body may include a single-crystal piezoelectric thin-film having multiple domains, which may include a nominal domain adjacent to an inverted domain. The nominal domain may have multiple dipoles substantially oriented in a nominal orientation and the inverted domain may have dipoles substantially oriented in an inverted orientation, such that the inverted orientation is translated about 180 degrees from the nominal orientation.

An application example of a MEMS vibrating structure is its use in filtering 172 in a mobile terminal 174, the basic architecture of which is represented in FIG. 24. The mobile terminal 174 may include a receiver front end 176, a radio frequency transmitter section 178, an antenna 180, a duplexer or switch 182, a baseband processor 184, a control system 186, a frequency synthesizer 188, and an interface 190. The receiver front end 176 receives information bearing radio frequency signals from one or more remote transmitters provided by a base station (not shown). A low noise amplifier (LNA) 192 amplifies the signal. The filtering 172 minimizes broadband interference in the received signal, while down conversion and digitization circuitry 194 down converts the filtered, received signal to an intermediate or baseband frequency signal, which is then digitized into one or more digital streams. The receiver front end 176 typically uses one or more mixing frequencies generated by the frequency synthesizer 188. The baseband processor 184 processes the digitized received signal to extract the information or data bits conveyed in the received signal. This processing typically comprises demodulation, decoding, and error correction operations. As such, the baseband processor 184 is generally implemented in one or more digital signal processors (DSPs).

On the transmit side, the baseband processor 184 receives digitized data, which may represent voice, data, or control information, from the control system 186, which it encodes for transmission. The encoded data is output to the transmitter 178, where it is used by a modulator 196 to modulate a carrier signal that is at a desired transmit frequency. Power amplifier circuitry 198 amplifies the modulated carrier signal to a level appropriate for transmission, and delivers the amplified and modulated carrier signal to the antenna 180 through the duplexer or switch 182.

A user may interact with the mobile terminal 174 via the interface 190, which may include interface circuitry 200 associated with a microphone 202, a speaker 204, a keypad 206, and a display 208. The interface circuitry 200 typically includes analog-to-digital converters, digital-to-analog converters, amplifiers, and the like. Additionally, it may include a voice encoder/decoder, in which case it may communicate directly with the baseband processor 184. The microphone 202 will typically convert audio input, such as the user's voice, into an electrical signal, which is then digitized and passed directly or indirectly to the baseband processor 184. Audio information encoded in the received signal is recovered by the baseband processor 184, and converted by the interface circuitry 200 into an analog signal suitable for driving the speaker 204. The keypad 206 and the display 208 enable the user to interact with the mobile terminal 174, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A vibrating micro-electro-mechanical circuit comprising:
   a substrate having a substrate surface;
   at least one anchor on the substrate surface; and
   a micro-electro-mechanical systems (MEMS) vibrating structure comprising:
      a body suspended from the at least one anchor and comprising a single-crystal piezoelectric thin-film having a plurality of domains comprising a nominal domain adjacent to an inverted domain, such that the nominal domain has a first plurality of dipoles substantially oriented in a nominal orientation and the inverted domain has a second plurality of dipoles substantially oriented in an inverted orientation, wherein the inverted orientation is translated about 180 degrees from the nominal orientation;
      a first conducting section residing on a first surface of the body that is about parallel to the substrate surface and comprising a first plurality of conducting fingers extending at least partially across an outer width of the MEMS vibrating structure; and
      a second conducting section residing on the first surface of the body, comprising at least one conducting finger each extending both at least partially across the outer width of the MEMS vibrating structure and generally between two of the first plurality of conducting fingers;

such that the MEMS vibrating structure has dominant vibrations when a first electrical signal is applied to the first conducting section and a second electrical signal is applied to the second conducting section.

2. The vibrating micro-electro-mechanical circuit of claim 1 wherein the MEMS vibrating structure further comprises a conducting layer in contact with a second surface of the body that is about parallel to the substrate surface.

3. The vibrating micro-electro-mechanical circuit of claim 2 wherein the first electrical signal is applied to the first conducting section and the conducting layer and the second electrical signal is applied to the second conducting section and the conducting layer.

4. The vibrating micro-electro-mechanical circuit of claim 3 wherein both of the first electrical signal and the second electrical signal are AC signals.

5. The vibrating micro-electro-mechanical circuit of claim 4 wherein the first electrical signal is phase shifted approximately 180 degrees from the second electrical signal.

6. The vibrating micro-electro-mechanical circuit of claim 1 wherein the dominant vibrations are dominant lateral vibrations that are about parallel to the substrate surface.

7. The vibrating micro-electro-mechanical circuit of claim 1 wherein the single-crystal piezoelectric thin-film provides the dominant vibrations.

8. The vibrating micro-electro-mechanical circuit of claim 6 wherein the dominant vibrations are based on a direction of a cut of growth of the single-crystal piezoelectric thin-film.

9. The vibrating micro-electro-mechanical circuit of claim 1 wherein the plurality of domains comprises nominal domains that alternate with inverted domains along a plane that is about parallel to the substrate surface.

10. The vibrating micro-electro-mechanical circuit of claim 9 wherein the nominal domains alternate with the inverted domains in only one direction.

11. The vibrating micro-electro-mechanical circuit of claim 9 wherein each of the nominal domains is associated with a single one of the first plurality of conducting fingers and the at least one conducting finger.

12. The vibrating micro-electro-mechanical circuit of claim 11 wherein each of the associated one of the first plurality of conducting fingers and the at least one conducting finger extends down a center of one of the plurality of domains.

13. The vibrating micro-electro-mechanical circuit of claim 9 wherein the nominal domains and the inverted domains are formed by poling.

14. The vibrating micro-electro-mechanical circuit of claim 13 wherein the poling uses an electric field.

15. The vibrating micro-electro-mechanical circuit of claim 14 wherein the electric field has a nominal poling orientation when poling the nominal domains and an inverted poling orientation when poling the inverted domains, wherein the inverted poling orientation is translated about 180 degrees from the nominal poling orientation.

16. The vibrating micro-electro-mechanical circuit of claim 15 wherein the nominal orientation is not parallel to the nominal poling orientation and the inverted orientation is not parallel to the inverted poling orientation.

17. The vibrating micro-electro-mechanical circuit of claim 9 wherein the nominal domains and the inverted domains are periodically-poled.

18. The vibrating micro-electro-mechanical circuit of claim 9 wherein the nominal domains and the inverted domains are non-periodically-poled.

19. The vibrating micro-electro-mechanical circuit of claim 9 wherein each of the nominal domains has a nominal domain length and a nominal domain width that is constant along the nominal domain length, and each of the inverted domains have an inverted domain length and an inverted domain width that is constant along the inverted domain length.

20. The vibrating micro-electro-mechanical circuit of claim 1 further comprising:
a first mechanical support member between one of the at least one anchor and the MEMS vibrating structure; and
a second mechanical support member between another of the at least one anchor and the MEMS vibrating structure.

21. The vibrating micro-electro-mechanical circuit of claim 1 wherein the single-crystal piezoelectric thin-film comprises Lithium Tantalate.

22. The vibrating micro-electro-mechanical circuit of claim 1 wherein the single-crystal piezoelectric thin-film comprises Lithium Niobate.

23. A method comprising:
providing a vibrating micro-electro-mechanical circuit comprising:
a substrate having a substrate surface;
at least one anchor on the substrate surface; and
a micro-electro-mechanical systems (MEMS) vibrating structure comprising:
a body suspended from the at least one anchor and comprising a single-crystal piezoelectric thin-film having a plurality of domains comprising a nominal domain adjacent to an inverted domain, such that the nominal domain has a first plurality of dipoles substantially oriented in a nominal orientation and the inverted domain has a second plurality of dipoles substantially oriented in an inverted orientation, wherein the inverted orientation is translated about 180 degrees from the nominal orientation;
a first conducting section residing on a first surface of the body that is about parallel to the substrate surface and comprising a first plurality of conducting fingers extending at least partially across an outer width of the MEMS vibrating structure; and
a second conducting section residing on the first surface of the body, comprising at least one conducting finger extending both at least partially across the outer width of the MEMS vibrating structure and generally between two of the first plurality of conducting fingers; and
applying a first electrical signal to the first conducting section and applying a second electrical signal to the second conducting section to produce dominant vibrations the MEMS vibrating structure.

24. The method of claim 23 wherein the MEMS vibrating structure further comprises a conducting layer in contact with a second surface of the body that is about parallel to the substrate surface.

25. The method of claim 24 wherein the first electrical signal is applied to the first conducting section and the conducting layer and the second electrical signal is applied to the second conducting section and the conducting layer.

* * * * *